US007346051B2

(12) United States Patent
Nakayama et al.

(10) Patent No.: US 7,346,051 B2
(45) Date of Patent: Mar. 18, 2008

(54) SLAVE DEVICE, MASTER DEVICE AND STACKED DEVICE

(75) Inventors: Takeshi Nakayama, Nishinomiya (JP); Eiji Takahashi, Kashiba (JP); Yoshiyuki Saito, Katano (JP); Yukihiro Ishimaru, Hirakata (JP); Hideki Iwaki, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 326 days.

(21) Appl. No.: 11/149,171

(22) Filed: Jun. 10, 2005

(65) Prior Publication Data

US 2005/0289269 A1    Dec. 29, 2005

(30) Foreign Application Priority Data

Jun. 25, 2004 (JP) ............................. 2004-187697
Jun. 25, 2004 (JP) ............................. 2004-187700

(51) Int. Cl.
*H04Q 11/00* (2006.01)
*H04L 12/50* (2006.01)
*H04L 12/28* (2006.01)
*H04L 12/56* (2006.01)
*H02J 13/00* (2006.01)
*G06F 3/00* (2006.01)
*G06F 15/76* (2006.01)

(52) U.S. Cl. ............... 370/386; 370/399; 340/3.53; 340/3.54; 340/825.52; 700/3; 709/211; 710/4; 710/9; 710/305; 712/31

(58) Field of Classification Search .............. 370/217, 370/338, 386, 399.01, 419, 420, 461; 340/568.7, 340/815.67, 825.52; 710/63, 110, 305; 709/208, 709/209; 700/3; 327/202
See application file for complete search history.

(56) References Cited

U.S. PATENT DOCUMENTS

| 4,924,461 | A | * | 5/1990 | Amemiya et al. | .......... 370/449 |
|---|---|---|---|---|---|
| 5,396,218 | A | * | 3/1995 | Olah | ................. 340/568.7 |
| 6,785,272 | B1 | * | 8/2004 | Sugihara | .................. 370/386 |
| 7,116,674 | B2 | * | 10/2006 | Shi | .................. 370/419 |
| 7,193,986 | B2 | * | 3/2007 | Scanlon et al. | ............ 370/338 |
| 7,231,483 | B2 | * | 6/2007 | Gros et al. | ................ 710/305 |
| 2005/0243836 | A1 | * | 11/2005 | Truitt et al. | ............ 370/395.52 |
| 2006/0244624 | A1 | * | 11/2006 | Wang et al. | ........... 340/815.67 |

FOREIGN PATENT DOCUMENTS

JP    2002-50735    2/2002

* cited by examiner

*Primary Examiner*—Crystal J. Barnes
(74) *Attorney, Agent, or Firm*—Wenderoth, Lind & Ponack, L.L.P.

(57) ABSTRACT

A stacked device is disclosed which is easily manufactured while identifying a plurality of devices that are stacked in the stacked device. The stacked device includes a stack of a plurality of slave devices and a master device having identical terminal arrangements. Here, the master device includes command transmission unit configured to input an identification command to a terminal of an adjacent slave device. Furthermore, the slave device includes a through-wire for interconnecting at least one terminal of that same device and an adjacent slave device; command reception unit configured to receive the identification command; and ID (identifier) setting unit configured to set the ID of that same device based on the identification command; the positions of the terminals that are interconnected with the adjacent slave devices differing in each slave device, so that, in each slave device, the slave device command reception unit receive an identification command having a modified value as a result of transiting through-wires that are connected at differing positions in each slave device.

7 Claims, 30 Drawing Sheets

Identification commands received by the slave devices
(clamped to (1, 1, 1) before receiving the identification command)

|  | first CS terminal | second CS terminal | third CS terminal |
|---|---|---|---|
| Master device | 0 | 0 | 0 |
| first slave device | 0 | 0 | 0 |
| second slave device | 1 | 0 | 0 |
| third slave device | 1 | 1 | 0 |

*Fig. 5*

| device count detection table ||
| differentiation signal potential (V) | slave device count |
|---|---|
| 5.00~1.80 | 1 |
| 1.80~1.50 | 2 |
| 1.50~1.10 | 3 |
| 1.10~0.90 | 4 |
| 0.90~0.70 | 5 |
| ⋮ | ⋮ |

| 1620 | resist |
| 1621 | hole |
| 1513 | insulating film |
| 1514 | electrode |
| 1518 | junction material layer |

SLAVE DEVICE, MASTER DEVICE AND STACKED DEVICE

BACKGROUND OF THE INVENTION

1. Field of the Invention

The present invention relates to a stacked device comprising a stack of a master device and a plurality of slave devices, and to slave devices and master devices therefor.

2. Background Information

Stacked devices have been developed, which comprise a plurality of semiconductor devices for performing various processing tasks and a control device such as a CPU for controlling the semiconductor devices, which are stacked on a board. By stacking semiconductor devices on a board in this manner, it is possible to reduce the size and weight of the product containing the semiconductor devices. Here, each of the semiconductor devices is assigned, in advance, a specific ID (identifier), at the wafer fabrication stage. The control device can access each semiconductor devices based on this specific ID so as to control each of the semiconductor devices.

Furthermore, JP-2002-50735-A discloses a method for identifying semiconductor devices in a three-dimensional installation. FIG. 32 is a structural diagram of a three-dimensional stacked semiconductor device according to this JP-2002-50735-A. As shown in FIG. 32, on a first semiconductor device 1 are stacked a second and a third semiconductor device 2 and 3, having identical terminal structures. The back and the front sides of each semiconductor device are electrically connected by a through-wire that passes through the interior of the substrate. Furthermore, the terminals at the same positions on each of the semiconductor devices contact each other. By virtue of this structure, signals for controlling the devices can be transmitted in common from the control device to the first, second and third semiconductor devices 1, 2 and 3.

Each of the semiconductor devices is provided with a control terminal for inputting various control signals and a CS (chip select) terminal for inputting a select signal for putting the devices in the selected state. Control terminals for the first semiconductor device 1 include, for example, a control terminal 12a and a control terminal 12b. Furthermore, CS terminals for the first semiconductor device 1 include CS terminals 11a, 11b, 13a, 13b, 15a and 15b. The control terminal 12a on the back side 1a of the first semiconductor device 1 and the control terminal 12b, on the front side 1b thereof, are connected by a perpendicular through-wire 51. Here, the perpendicular through-wire is a through-wire that is perpendicular to the front and back sides, and which transmits various control signals. Furthermore, the control terminal 12b on the front side 1b of the first semiconductor device 1 contacts the control terminal 18a on the back side 2b of the second semiconductor device 2; and the control terminal 18b on the front side 2b of the second semiconductor device 2 contacts the control terminal 20a on the back side 3a of the third semiconductor device 3. By virtue of this structure, common control signals are sent to the first, second and third semiconductor devices 10, 20 and 30 by way of the perpendicular through-wires and the terminals, which contact each other.

Furthermore, the CS terminals 11a, 13a and 15a on the back side 1a of the first semiconductor device 1 are connected to the CS terminals 11b, 13b and 15b on the front side 1b thereof, by way of inclined through-wires 31, 33 and 35. Here, the inclined through-wires pass through the front and back sides of the semiconductor devices and intersect these front and back sides at an inclined angle. Furthermore, the CS terminal 11b on the front side 1b of the first semiconductor device 1 contacts the CS terminal 17a on the back side 2a of the second semiconductor device 2; and the CS terminal 13b on the front side 1b of the first semiconductor device 1 contacts the CS terminal 19a on the back side 2a of the second semiconductor device 2. The other CS terminals and the inclined through-wires are also interconnected as shown in FIG. 32. Here, a control device (not shown in the drawing) provided below the first semiconductor device 1 sends select signals for placing the semiconductor devices in the selected state by way of predetermined terminals, so as to access the desired semiconductor device.

For example, the select signal transmitted by way of the CS terminal 11a on the first semiconductor device 1 reaches the CS terminal 21b on the third semiconductor device 3 by way of: the CS terminal 11a→the through-wire 31→the CS terminal 11b→the CS terminal 17a→the through-wire 37→the CS terminal 17b→the CS terminal 21a→the through-wire 41→the CS terminal 21b. Consequently, the third semiconductor device 3 enters the selected state and the third semiconductor terminal 3 receives various control signals from the control device by way of the control terminals and the perpendicular through-wires. Likewise, the select signal transmitted by way of the CS terminal 13a on the first semiconductor device 1 reaches the CS terminal 19b on the second semiconductor device 2 by way of: the CS terminal 13a→the through-wire 33→the CS terminal 13b→the CS terminal 19a→the through-wire 39→the CS terminal 19b. Consequently, the second semiconductor device 2 enters the selected state. Furthermore, the select signal transmitted by way of the CS terminal 15a on the first semiconductor device 1 reaches the CS terminal 15b on the first semiconductor device 1 by way of: the CS terminal 15a→the through-wire 35→the CS terminal 15b. Consequently, the first semiconductor device 1 enters the selected state.

By selecting CS terminals so as to transmit select signals, it is possible to access each of the semiconductor devices separately.

However, if specific IDs are assigned beforehand at the wafer fabrication stage, it is necessary to store the predetermined IDs in the control device that controls the semiconductor devices beforehand. Accordingly, it is necessary to deal with the question of which semiconductors, having which IDs, are stacked in the device. In particular, it is extremely difficult to manage semiconductor devices according to individually assigned IDs, because a large number of semiconductor devices are fabricated in a single wafer.

In this regard, according to JP-2002-50735-A, it is not necessary to assign a specific ID to each semiconductor device when the wafer is fabricated, because each semiconductor device can be identified by the connections of the CS terminals and the inclined through-wires. However, in order to allow unique access to each of the semiconductor devices, via one CS terminal, it is necessary to stack the semiconductor devices with consideration given to the combinations of inclined through-wires and CS terminals. That is to say, in the aforementioned FIG. 32, only the third semiconductor device 3 can be accessed from the CS terminal 11a; only the second semiconductor device 2 can be accessed from the CS terminal 13a; and only the first semiconductor device 1 can be accessed from the CS terminal 15a. Accordingly, it is necessary to stack the semiconductor devices with consideration for the combinations of the CS terminals and the position of the semiconductor device to be accessed in the stack.

Furthermore, according to JP-2002-50735-A, in order to place specific semiconductor devices in selected states, it was, in particular, necessary to form inclined through-wires. Special operations are required to form inclined through-wires, and they can not easily be formed with high accuracy. Furthermore, it was necessary to provide perpendicular through-wires for connecting the control terminals with each other and inclined through-wires for connecting the CS terminals with each other, which is to say it was necessary to provide two types of through-wires, which complicated the manufacturing process.

Here, an object of the present invention is to provide technology allowing for the easy manufacture of a stacked device while identifying a plurality of devices that are stacked in the stacked device.

In view of the above, there exists a need for a slave device, master device, and stacked device which overcomes the above mentioned problems in the prior art. This invention addresses this need in the prior art as well as other needs, which will become apparent to those skilled in the art from this disclosure.

SUMMARY OF THE INVENTION

In order to solve the aforementioned problems, a first aspect of the present invention is a stacked device comprising a stack of a master device and plurality of slave devices having identical terminal arrangements.

Here, the master device comprises: a command transmission unit configured to input an identification command to the terminals of an adjacent slave device; an ID reception configured to receive, from the slave devices, slave device IDs that were set in response to the identification command; and a correspondence storage unit configured to store the correspondences between the slave devices and the IDs.

Furthermore, each slave device comprises: a through-wire for interconnecting at least one terminal of the slave device and an adjacent slave device; a command reception unit configured to receive the identification command; and an ID setting unit configured to set the ID of the slave device based on the identification command; the positions of the terminals that are interconnected with the adjacent slave devices differing in each slave device, so that, in each slave device, the slave device command reception unit receive an identification command having a modified value as a result of transiting through-wires that are connected at differing positions in each slave device.

The expression, "identical terminal arrangements," means that the arrangement of terminals such as an address terminal, a read/write terminal, and a CS (chip select) terminal is the same on the slave devices and on the master device. The slave device has, for example, at least as many CS terminals, for inputting identification commands, as there are layers in the stacked device. Furthermore, the identification command comprises, for example, a number of bits that is equal to the number of layers in the stacked device. At least one CS terminal of each slave device is interconnected via a through-wire that passes through the slave device, and each CS terminal is clamped at a first potential. Here, by arranging the through-wires at different positions, the combination of interconnections between CS terminals can be made to differ for each slave device. For example, if certain CS terminals are electrically interconnected by a through-wire, a corresponding single bit of the identification command from the master device is transmitted, and the potential of that CS terminal is changed from the first potential. Meanwhile, as through-wires are not provided at parts for connecting other CS terminals, the identification command is not input to those CS terminals, and the potentials thereof do not change.

By way of this configuration, when the identification command sent by the master device is received by the slave device, the identification command comprises different information at each slave device. The ID setting unit of the slave devices set slave device specific IDs for each slave device, in response to the differing identification commands. Accordingly, even if the slave devices are interconnected via through-wires by terminals having identical terminal structures, the master device is able to access each slave device by way of the IDs which have been set. For example, the master device first selects the slave device to be controlled on the basis of the ID, and places this slave device in the selected state. Thereafter, this slave device is controlled in various ways by sending commands thereto. Here, the ID may, for example, be information for identifying a selection signal line for uniquely accessing each of the slave devices. By setting an individual selection signal line for each slave device, it is possible to uniquely place each of the slave devices in the selected state.

Furthermore, because the through-wires interconnect corresponding terminals with identical terminal structures, the through-wires can be formed perpendicular to the slave device. Accordingly, there is no need for complicated manufacturing processes such as forming the through-wires at an inclined angle with respect to the slave device, and thus the stacked device can be manufactured easily.

Furthermore, the stacked device can be manufactured by stacking the slave devices in which IDs have not yet been set, and then setting the IDs described above when the stacked device is initialized. After initialization is complete, the master device accesses each of the slave devices on the basis of the IDs that have been set. Thus, even if the slave devices do not have IDs before being used to construct the stacked device, the IDs can be set after manufacturing the stacked device. In other words, there is no need to assign an ID to each slave device before manufacturing the stacked device. Accordingly, there is no need to assign an ID in each slave device when large numbers of slave devices are manufactured as chips on a wafer. Consequently, it is possible to eliminate the difficulty of managing each slave device according to the ID after dicing. For example, there is no need for difficult operations such as selecting slave devices according to IDs from amongst a large number of slave devices that have been diced from a wafer.

Note that each slave device receives an identification command according to the connection configuration of the through-wires after stacking. Thus, because the IDs of the slave devices are set in respond to this identification command, there is no need to give special consideration to the stacking order or stacking method when stacking the slave devices. Accordingly, it is, for example, possible to stack the slave devices in a freely chosen manner, allowing the stacked device to be easily manufactured.

Furthermore, the CS terminals of the slave devices, to which the identification commands are input, are interconnected via the through-wires. In other words, there is no need for dedicated CS terminals for each slave device for the purpose of receiving the identification commands. Furthermore, because the identification command is modified by passing through the slave devices, there is no need to input slave device specific identification commands for each slave device.

According to a second aspect of the present invention, in the invention as recited in the first aspect thereof, in the slave devices: before the identification command is input, the terminal to which the identification command is input is clamped at a predetermined potential (hereinafter referred to as a first potential); and the identification command that is received by the command reception unit is generated by changing the potential of the terminal from the first potential as a result of inputting the identification command via the through-wire.

Each slave device has a plurality of CS (chip select) terminals, and corresponding CS terminals are connected via through-wires. Here, the through-wire connection configurations are such that the connections differ for each slave device. If CS terminals are interconnected via through-wires, the potentials of the CS terminals change from the predetermined potential as the result of receiving a potential in accordance with the identification command. Meanwhile, the CS terminals that are not connected by through-wires remain clamped at the predetermined potential. The identification command is generated according to whether the CS terminals remain clamped or change in response to the identification command.

In more concrete terms, an example will be described in which three slave devices are stacked. The slave devices are, in order of their proximity to the master device, a first slave device A, a second slave device B and a third slave device C, each of which have three CS terminals. Here, the first slave device A comprises a first CS terminal A1, a second CS terminal A2 and a third CS terminal A3; the second slave device B has a first CS terminal B1, a second CS terminal B2 and a third CS terminal B3; and the third slave terminal C has a first CS terminal C1, a second CS terminal C2 and a third CS terminal C3. Furthermore, the CS terminals are clamped at the first potential and the arrangement of the first CS terminals A1, B1 and C1, the arrangement of the second CS terminals A2, B2 and C2, and the arrangement of the third CS terminals A3, B3 and C3 are the same. Moreover, the second CS terminal A2 and the second CS terminal B2 are connected via a through-wire that passes through the second slave device B. Consequently, the master device, the second CS terminal A2 of the closest slave device A and the second CS terminal B2 of the second closest slave device B are electrically connected. Furthermore, the third CS terminal A3 and the third CS terminal B3 are connected via a through-wire that passes through the second slave device B, while the third CS terminal B3 and the third CS terminal C3 are connected via a through-wire that passes through the third slave device C. Consequently, the master device, the third CS terminal A3 of the closest slave device A, the third CS terminal B3 of the second closest slave device B, and third CS terminal C3 of the third closest slave device C, are electrically connected.

Here, the states of the first CS terminal A1, the second CS terminal A2 and the third CS terminal A3, which are clamped at the first potential, represent bits (1, 1, 1). Next, an identification command comprising the combination (0, 0, 0) is input to the first CS terminal A1, the second CS terminal A2 and the third CS terminal A3, respectively. Thereupon, the states of the first CS terminal A1, the second CS terminal A2 and the third CS terminal A3 change from (1, 1, 1) to (0, 0, 0). Accordingly, the first slave device A receives (0, 0, 0) from the first CS terminal A1, the second CS terminal A2 and the third CS terminal A3. Here, (0, 0, 0) is the identification command received by the first slave device A, which corresponds to the identification command sent from the master device. The first CS terminal B1 of the second slave device B remains clamped at the first potential, because the first CS terminal B1 is not connected to the first CS terminal A1. Accordingly, the second slave device B receives the identification command (1, 0, 0). Furthermore, the first CS terminal C1 of the third slave device C and the second CS terminal C2 thereof remain clamped at the first potential, because the first CS terminal C1 and the first CS terminal B1 are not connected, and the second CS terminal C2 and the second CS terminal B2 are not connected. Accordingly, the third slave device C receives the identification command (1, 1, 0). As described above, the value of the identification command sent by the master device changes to a different value at each slave device. The slave device ID setting unit set slave device specific IDs in accordance with this identification command, so that the master device can identify the slave devices according to their IDs.

A third aspect of the present invention is a stacked device comprising a stack of a master device and a plurality of slave devices, having identical terminal arrangements.

Here, the master device comprises: a first command transmission unit configured to input an identification command to a terminal of an adjacent slave device; an ID reception unit configured to receive, from the slave devices, slave device IDs that have been set in response to the identification command; and a correspondence storage unit configured to store correspondences between the slave devices and the IDs.

Furthermore, each slave device comprises: a through-wire for interconnecting at least one terminal of the slave device and an adjacent slave device; a command reception unit configured to receive the identification command from the master device or an adjacent slave device; an ID setting unit configured to set an ID for the slave device, as a result of receiving the identification command; a command modification unit configured to modify the received identification command to a slave device specific identification command; and a second command transmission unit configured to input the modified identification command to an adjacent slave device via the through-wire.

Each slave device modifies the received identification command and outputs it to an adjacent slave device. Accordingly, the slave devices receive specific identification commands and can set the slave device specific ID on the basis of that specific identification command.

According to a fourth aspect of the present invention, the invention recited in the third aspect of thereof further comprises completion a notification transmission unit configured to transmit to the master device, via the through-wire, a completion notification indicating that setting of the ID has been completed, when the ID setting unit have set the ID.

Because the completion notification transmission unit transmit a completion notification to the master device, the master device can determine whether or not an ID has been set in each of the slave devices. For example, if the master device does not receive a completion notification from a slave device within a predetermined period of time after identification command transmission, the master device determines that setting of the IDs in each of the slave devices has been completed. The number of slave devices in the stack can be changed according to the functions required of the product, and is not fixed data. Consequently, the master device does not know how many slave devices there are in the stack. As a result, the master device can reduce time wasted in waiting for setting completion by knowing that the ID setting has been completed in the slave devices. Furthermore, the master device can move to the subsequent operations as the same time as completion notification is given.

A fifth aspect of the present invention is a master device for a stacked device comprising a stack of the master device and a plurality of slave devices having identical terminal arrangements, the master device comprising a command transmission unit configured to input an identification command to a terminal of an adjacent slave device; an ID reception unit configured to receive, from the slave devices, slave device IDs that have been set according to the identification command; and a correspondence storage unit configured to store the correspondences between the slave devices and the IDs.

The master device can access each of the slave devices based on the IDs. Furthermore, because it is possible to set the IDs after manufacturing the slave devices, it is not necessary to assign a specific ID to each slave device when these are manufactured. Accordingly, if large numbers of slave devices are manufactured as chips on a wafer, these can easily be managed without the difficulty of managing each slave device according to the ID thereof.

A sixth aspect of the present invention is a slave device for a stacked device comprising a stack of a master device and a plurality of the slave devices having identical terminal arrangements, comprising: a through-wire for interconnecting at least one terminal of the slave device and an adjacent slave device; a command reception unit configured to receive an identification command from the master device; and ID setting unit configured to set the ID of the slave device based on the identification command; the positions of the terminals that are interconnected with the adjacent slave device differing in each slave device, so that, in each slave device, the slave device command reception unit receives an identification command having a modified value as a result of transiting through-wires that are connected at differing positions in each slave device.

By virtue of this configuration, an operative effect similar to that of the first aspect of the present invention can be achieved.

A seventh aspect of the present invention is slave device for a stacked device comprising a stack of a master device and a plurality of slave devices, having identical terminal arrangements, comprising: a through-wire for interconnecting at least one terminal of the slave device and an adjacent slave device; a command reception unit configured to receive an identification command from the master device or an adjacent slave device; a command modification unit configured to modify the received identification command to a slave device specific identification command; a second command transmission unit configured to input the modified identification command to an adjacent slave device via the through-wire; and an ID setting unit configured to set an ID for the slave device as a result of receiving the identification command. By virtue of this configuration, an operative effect similar to that of the third aspect of the present invention can be achieved.

Moreover, the present invention can also provide the following stacked device comprising a stack of a master device and a plurality of slave devices having identical terminal arrangements.

Here, the master device comprises: a command transmission unit configured to input a random number generation command for starting random number generation to a terminal of a adjacent slave device; a determination unit configured to receive random numbers generated by the slave devices and determining whether or not the values of the random numbers are different from each other; an ID reception unit configured to receive, from each slave device, the IDs of the slave devices that were set in response to the random number generation command; and a correspondence storage unit configured to store the correspondences between the slave devices and the IDs.

Furthermore, the slave device comprises: a through-wire for interconnecting at least one terminal of the slave device and an adjacent slave device; a command reception configured to receive a random number generation command; a random number generation unit configured to generate a random number in response to the random number generation command and sending the generated random number to the master device; and an ID setting unit configured to set the ID of that the slave device based on the based on the result of a determination by the determination unit of the master device.

The master device receives random numbers generated in each slave device and determines whether or not all of those random numbers are different. If all of the generated random numbers are different, the slave devices set the specific IDs on the basis of the random numbers generated by each slave device. Accordingly, if slave devices having identical terminal configurations are stacked in a stacked device, the master device can control each slave device on the basis of the ID thereof.

Furthermore, it is possible to set IDs that allow each slave device to be identified, without varying the physical wiring configurations or connection states of the slave devices. Moreover, it is also unnecessary to vary the physical connection state or number of terminals provided on the slave devices according to the number of slave devices in the stack.

Moreover, in the present invention, the slave devices preferably further comprise an ID storage unit configured to store the IDs. Furthermore, the ID storage unit is preferably non-volatile memory. This prevents ID data from being lost. Furthermore, the ID storage unit preferably stores the ID at the time of inspection, before assembling the stacked device.

Moreover, the present invention can also provide a master device for a stacked device comprising a stack of a master device and a plurality of slave devices having identical terminal arrangements, the master device comprising: a command transmission unit configured to input a random number generation command for starting random number generation to a terminal of an adjacent slave device; and a determination unit configured to receive random numbers generated by the slave devices and determining whether or not the values of the random numbers are different from each other; the command transmission unit configured to transmit an ID fixing command to the slave devices if the determination unit determines that the values of random numbers from the slave devices are different.

When the slave device receives the ID fixing command, it sets the ID of the slave device based on the random number generated by the slave device. Consequently, the same operational effect as described above can be achieved.

Here, the master device preferably further comprises a stack layer count storage unit configured to store the number of slave devices in the stack, and a range setting unit configured to set range information indicating a range for the random numbers to be generated by the slave devices, the command generation unit generating a random number generation command including the range information.

Moreover, a master device is preferably provided comprising: a first wire for interconnecting the slave devices, each of which having an internal resistor, via these internal resistors; a potential detection unit which is connected to the first wire, and which is configured to detect a potential output by the first wire, which corresponds to the number of slave device connections; and a connection count calculation unit configured to calculate the number of slave devices connected according to the detected potential. Because the potential that is output on the first wire corresponds to the number of slave devices connected, the master device can know the number of slave devices connected based on this potential. Accordingly, it is not necessary to store the number of connections beforehand, which increases freedom in terms of the number of slave devices that can be stacked in the stacked device. For example, this allows sudden changes in the number of stacked layers to be accommodated.

By virtue of the present invention, technology is provided that allows for the easy manufacture of a stacked device while identifying a plurality of devices that are stacked in the stacked device.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 5 shows one example of identification commands received by the command reception unit of the first through third slave devices shown in FIG. 3.

DETAILED DESCRIPTION OF THE PREFERRED EMBODIMENTS

First Embodiment

Overview of the Stacked Device

Figure 1:
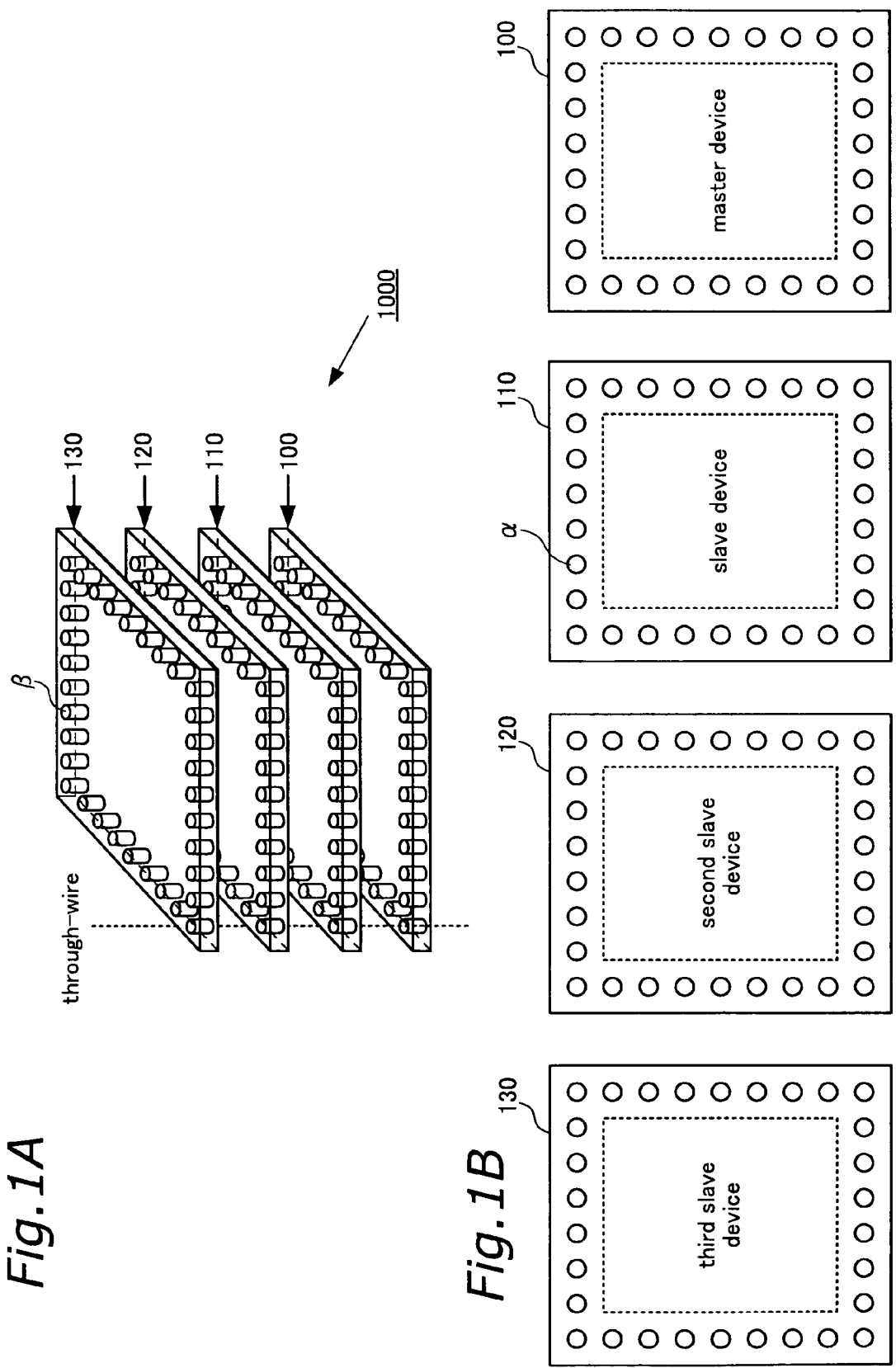
FIG. 1A is a schematic view of a stacked device according to a first embodiment of the present invention.
FIG. 1B is a schematic view of the terminal configuration of the master device and the slave devices in FIG. 1A.

FIG. 1A is a schematic view of a stacked device according to a first embodiment of the present invention; FIG. 1B is a schematic view of the terminal configuration of the slave devices and the master devices in FIG. 1A. A stacked device 1000 comprises a stack of: a master device 100 for controlling each of the slave devices in the stack; and a first slave device 110, a second slave device 120 and a third slave device 130, for performing various types of control in response to instructions from the master device, in that order. The terminals α of the master device 100 and the slave devices are configured with identical terminal arrangements as shown in FIG. 1B, which is a plain view of the terminals. Accordingly, when the master device 100 and the slave devices are stacked, the terminals α of each of the devices are contacted. Furthermore, the slave devices each comprise a substrate and through-wires β, which pass through the slave devices, are provided corresponding to the terminals. Note that, the positions at which through-wires are located are described hereinbelow, and at certain positions through-wires are not provided. Thus, by stacking devices with identical terminal arrangements and interconnecting corresponding terminals via through-wires, various instructions from the master device are transmitted to each of the slave devices by way of the terminals and the through-wires.

Overview of Access to the Slave Devices

Figure 2:
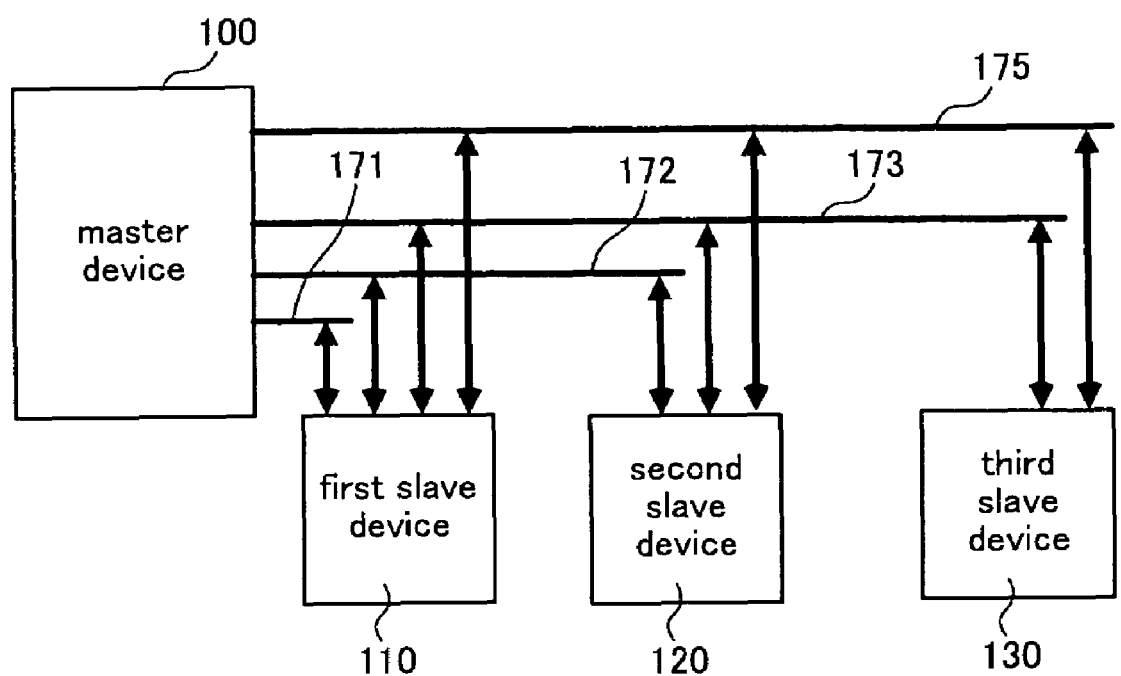
FIG. 2 is a schematic view of the bus wiring configuration of a stacked device according to the first embodiment of the present invention.

FIG. 2 is a conceptual diagram illustrating the bus wiring configuration of a stacked device according to the first embodiment of the present invention. The bus wiring comprises select signal lines (first select signal line 171, second select signal line 172 and third select signal line 173) for placing each of the slave devices in the selected state, and a data signal line 175. The master device 100 is connected to the first slave device 110 by way of the first select signal line 171; to the second slave device 120 by the second select signal line 172; and to the third slave device 130 by the third select signal line 173. Furthermore, the master device 100 is connected to the first–third slave devices 110 through 130, by the data signal line 175. Here, the master device 100 accesses the desired slave device by way of the select signal lines, and subsequently sends data only to the slave device being accessed by way of the data signal line 175. For example, if various controls are to be performed on the first slave device 110, the master device 100 sends a select signal by way of the first select signal line 171, so as to place the first slave device 110 in the selected state, and then sends control signals to the first slave device 110 by way of the data signal line 175. In this manner, even when the slave devices having identical terminal arrangements are stacked, it is possible to perform the desired control on any individual slave device.

Specific Configuration of the Stacked Device (1) Overall Configuration

Figure 3:
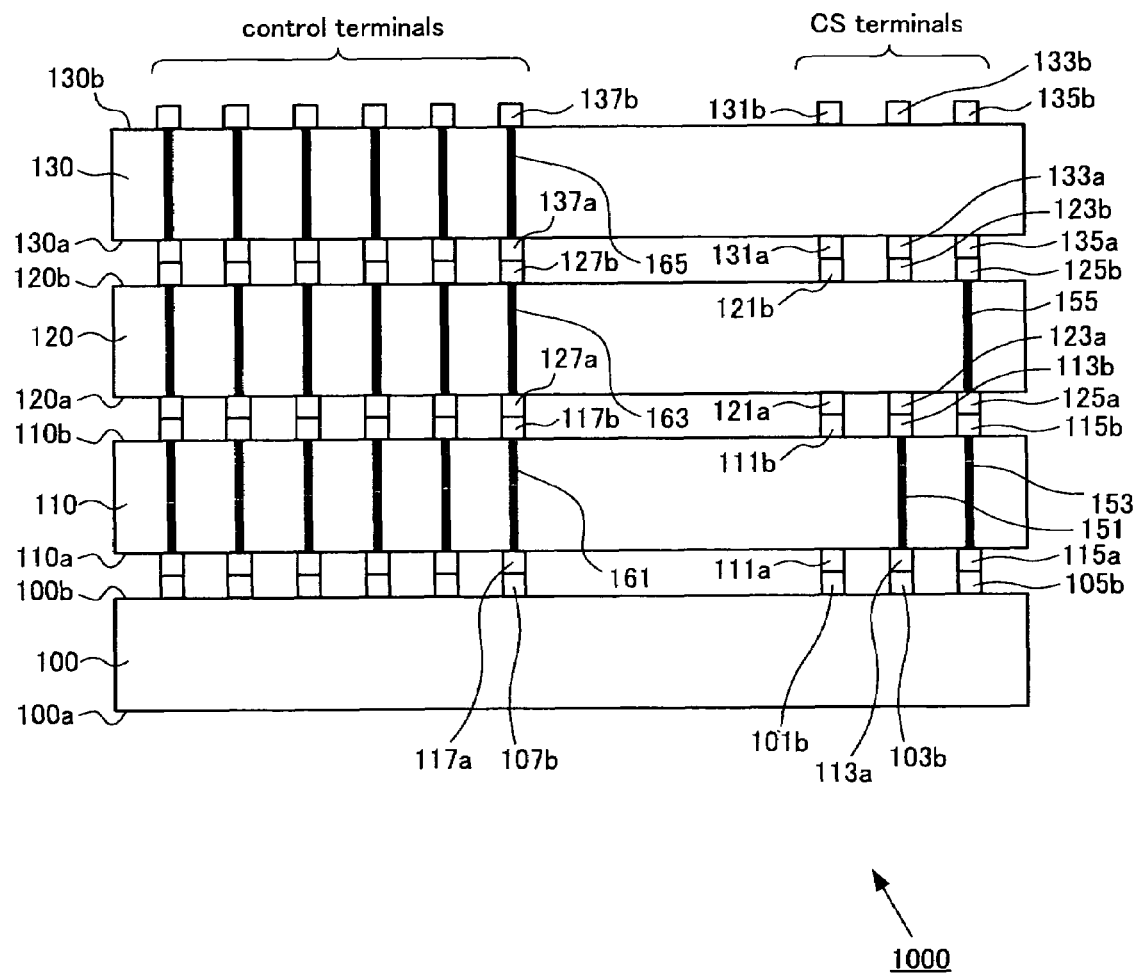
FIG. 3 is a schematic sectional view of a stacked device according to the first mode of embodiment.

FIG. 3 is a sectional structural view of a stacked device according to the first embodiment. The stacked device 1000 comprises a stack of: the master device 100, the first slave device 110, the second slave device 120, and the third slave device 130. As shown in the aforementioned FIG. 1B, the master device 100, and the first through third slave devices 110 through 130 have identical terminal configurations. Furthermore, the terminals comprise a plurality of control terminals to which are input control signals, in order to perform various types of processing in slave devices, and a plurality of CS terminals to which are input identification commands from the master device 100. The present example illustrates a case wherein three slave devices are stacked, but there is no limit on the number of layers in the stack.

(2) Configuration of the CS Terminals and Configuration of the CS Terminal Connections Via Through-Wires The first CS terminal 101b, the second CS terminal 103b and the third CS terminal 105b, on the front side 100b of the master device 100, are terminals for transmitting identification commands from the master device 100 to the slave devices stacked thereupon. Here, the term "identification command" refers to a command for the purpose of setting, in each slave device, an ID (identifier) for identifying the slave device, which may, for example, comprise a number of bits equal to the number of layers in the stack. For example, as shown in FIG. 3, if three slave devices are stacked, the identification command is configured as a command comprising, for example, three bits (0, 0, 0). Herein, when referring to the identification command (0, 0, 0) the bits are referred to in order from left to right as the first bit, the second bit and the third bit. Accordingly, the first bit "0" is sent from the first CS terminal 101b, the second bit "0" is sent from the second CS terminal 103b, and the third bit "0" is sent from the third CS terminal 105b.

Each of the slave devices also has CS terminals arranged in the same positions as on the master device 100. The number of the CS terminals on the master device 100 and on each of the slave devices is at least equal to the number of slave devices in the stack. Furthermore, before the identification command is input, each of the CS terminals is clamped at a predetermined potential, such as the source potential or the ground potential (hereinafter also referred to as the first potential, and represented by the numeral "1"). Next, some of the CS terminals of the slave devices are interconnected via through-wires 151, 153 and 155. That is to say, the positions at which the through-wires are arranged differ for each slave device so that certain CS terminals are interconnected via the through-wires but other CS terminals are not interconnected via through-wires. Note that the through-wires are wires that pass through the slave devices in the form of the substrate and are formed substantially perpendicular to the principal faces of the substrates. Next, with reference to FIG. 3, a specific example of a CS terminal configuration, and of a CS terminal connection configuration via through-wires, is described.

The first CS terminal 101b, the second CS terminal 103b and the third CS terminal 105b, on the front side 100b of the master device 100, contact the first CS terminal 111a, the second CS terminal 113a and the third CS terminal 115a, respectively, on the back side 10a of the first slave device 110. Furthermore, the second CS terminal 113a and the third CS terminal 115a, on the back side 110a of the first slave device 110, are connected with the second CS terminal 113b and the third CS terminal 115b, on the front side 110b of the first slave device 110, via the through-wires 151 and 153, respectively. Moreover, the second CS terminal 113b and the third CS terminal 115b, on the front side 10b of the first slave device 110, contact in the second CS terminal 123a and the third CS terminal 125a, on the back side 120a of the second slave device 120, respectively. Next, the third CS terminal 125a is connected to the third CS terminal 125b, on the front side 120b of the second slave device 120, via the through-wire 155. Furthermore, the third CS terminal 125b is connected to the third CS terminal 135a, on the back side 130a of the third slave device 130. Accordingly, an identification command is input to the first CS terminal 11a, the second CS terminals 113a, 113b and 123a, and the third CS terminals 115a, 115b, 125a, 125b and 135a, via the through-wires.

Meanwhile, the first CS terminal 111b, on the front side 110b of the first slave device 110, is not connected by a through-wire to the corresponding first CS terminal 111a on the front side 110a thereof. Likewise, the second CS terminal 123a, on the front side 120a of the second slave device 120, is not connected by a through-wire to the corresponding second CS terminal 123b, on the front side 120b thereof. Accordingly, an identification command is not input to the first CS terminals 111b, 121a, 121b, 131a and 131b, and the second CS terminals 123b, 133a and 133b.

By way of this connection configuration of CS terminals and through-wires, it is possible to set IDs allowing each of the slave devices to be identified. A method for setting the ID is described hereinbelow.

(3) Configuration of the Control Terminals and Configuration of the Control Terminal Connections Via Through-Wires The control terminals of each slave device have identical terminal arrangements, and respectively corresponding control terminals are connected via through-wires. The expression, "identical terminal configurations" means that the arrangement of terminals such as, for example, address terminals and read/write terminals, is identical. Thus, as the terminal arrangements are identical, signals having identical functions are transmitted to each of the slave devices from the master device 100.

The control terminals are connected via the through-wires; for example, in the following manner. As shown in FIG. 3, the control terminal 107b, on the front side 100b of the master device 100, contacts the control terminal 117a, on the back side 110a of the first slave device 110; the control terminal 117b, on the front side 110b of the first slave device 110, contacts the control terminal 127a, on the back side 120a of the second slave device 120; and the control terminal 127b, on the front side 120b of the second slave device 120, contacts the control terminal 137a, on the back side 130a of the third slave device 130. Moreover, the control terminal 117a is connected to the control terminal 1117b via a through-wire 161; the control terminal 127a is connected to the control terminal 127b via a through-wire 163; and the control terminal 137a is connected to the control terminal 137b via a through-wire 165. By virtue of such a configuration, control signals are sent from the master device 100 to the slave device that has been placed in the selected state in advance by sending a select signal.

Functional Configuration

Figure 4:
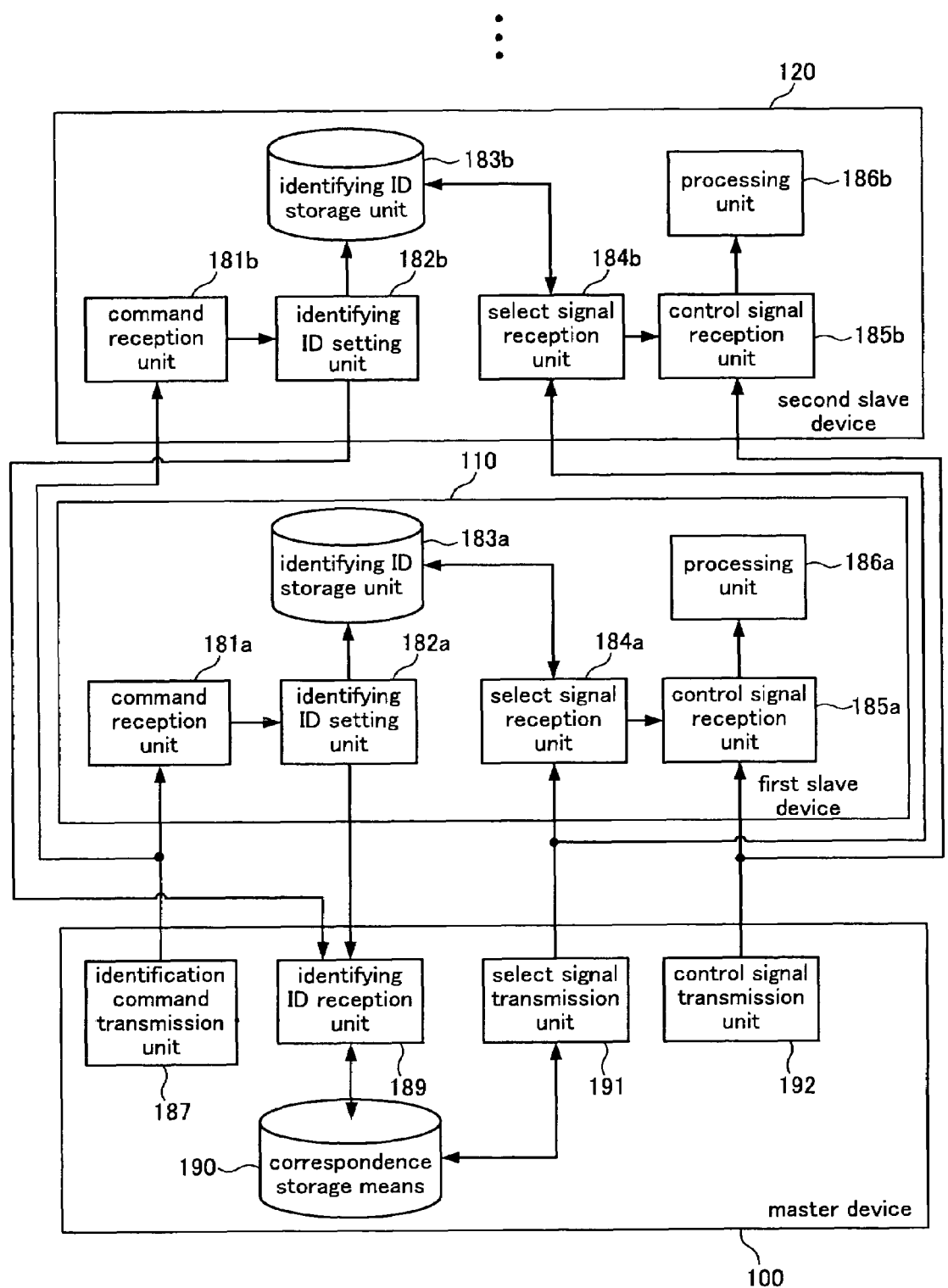
FIG. 4 is a functional block diagram of a master device and slave devices.

Next, the functional configuration of the master device and the slave devices, for the purpose of setting the IDs, is described. FIG. 4 is a functional block diagram of the master device and the slave devices.

(1) Master Device

The master device 100 comprises: an identification command transmission unit 187; an ID reception unit 189; an correspondence storage unit 190; a select signal transmission unit 191; and a control signal transmission unit 192.

The identification command transmission unit 187 generates an identification command and transmits the identification command to the slave devices via first through third CS terminals 101b, 103b and 105b. The ID reception unit 189 receives the slave device specific IDs that have been set by the slave devices. The master device 100 receives IDs for each of the slave devices, for example, via the through-wires that interconnect the control terminals. Note that the ID reception unit 189 may also receive select signal wire information for each of the slave devices as the ID, as described hereinafter. The correspondence storage unit 191 stores the received IDs in correspondence to the slave devices.

The select signal transmission unit 191 transmits a select signal to the slave device in question so as to place that slave device in a selected state that allows the necessary processing to be performed. At this time, the select signal is generated by the select signal transmission unit 191 on the basis of the ID stored in the correspondence storage unit 191 and the select signal is transmitted to this slave device. For example, the select signal may be generated so as to include the ID of the slave device to be accessed. Next, the control signal transmission unit 192 transmits control signals for the purpose of performing various controls on the slave device that has been placed in the selected state. Consequently, the master device is capable of causing the desired processing to be executed in this slave device alone.

(2) Functional Configuration of the Slave Device

The slave devices comprise: a command reception unit 181; an ID setting unit 182; an ID storage unit 183; a select signal reception unit 184; a control signal reception unit 185; and a processing unit 186. The command reception unit 181 receives identification commands from the master device 100 by way of the CS terminals. The identification command is sent to the slave devices from the master device 100. However, as shown in the aforementioned FIG. 3, depending on whether or not the CS terminals of the slave devices are connected by through-wires, it may be that not all of the bits in the identification command (0, 0, 0) are transmitted. For example, the first CS terminal 121a of the second slave device 120 does not receive the first bit "0" of the identification command. This is because the first CS terminal 111b of the first slave device 110, which is underneath the second slave device 120, is not connected by a through-wire. Accordingly, the first CS terminal 121a remains clamped at the first potential "1". Meanwhile, the second CS terminal 123a of the second slave device 120 and the third CS terminal 125a thereof received the other identification command bits, which is to say the second bit "0" and the third bid "0". Accordingly, the command reception unit 181 of the second slave device 120 receives an identification command (1, 0, 0) by way of the first CS terminal 121a, the second CS terminal 123a and the third CS terminal 125a.

As described above, the command reception units 181 of the slave devices receive identification commands having values that are modified according to the positions at which the through-wires are arranged. FIG. 5 shows the identification commands received by the command reception units of the first through third slave devices 110, 120 and 130, as shown in FIG. 3. As shown in FIG. 3, because the positions at which the through-wires are arranged are different in each of the slave devices, the values of the identification commands received by the command reception units 181 of the slave devices differ from each other.

The ID setting unit 182 set the ID of the device to which they belong based on these identification commands that have mutually differing values. As described above, because the values of the identification command differ at each slave device, slave device specific IDs can be set by setting corresponding IDs. The ID storage unit 183 stores the ID that has been set for the slave device.

The select signal reception unit 184 receives a select signal which, for example, includes an ID, from the select signal transmission unit 191 of the master device. Furthermore, the select signal reception unit 184 compares the ID in the ID storage unit 183 and the ID contained in the select signal, so as to determine whether or not the slave device has been selected. Here, if the slave device has been selected, the select signal reception unit 184 instructs the control signal reception unit 185 to receive control signals from the master unit 100. In response to this instruction, the control signal reception unit 185 receives control signals from the control signal transmission unit 192 of the master device 100 via the control terminals.

The processing unit 186 processes control signals received by the control signal reception unit 185 and performs various types of control.

Note that the ID setting units 182 of the slave devices may recognize select signal lines for placing the slave device in the selected state on the basis of the identification command, as described hereinafter. Next, the ID storage unit 183 stores the select signal line recognized by the ID setting unit 182. It is likewise possible to place individual slave devices in the selected state by setting select signal lines for each slave device in this manner.

Processing for Setting IDs

Next, processing for setting the IDs by the slave devices, on the basis of the connection configuration of the CS terminals and through-wires, as shown in the aforementioned FIG. 3 is described.

(1) Before Transmitting the Identification Command

Before transmitting the identification command to the slave devices, all of the CS terminals are clamped at the first potential "1". Next, the identification command transmission unit 187 of the master device 100 transmits an identification command comprising three bits (0, 0, 0) to the slave devices, via the first through third CS terminals 101b, 103b and 105b. Accordingly, the first bit "0" is sent from the first CS terminal 101b, the second bit "0" is sent from the second CS terminal 103b, and the third bit "0" is sent from the third CS terminal 105b. As a result of transmitting this identification command, the slave devices and the master device enter an ID setting mode.

(2) After Transmitting the Identification Command

The command reception units 181 of the slave devices receive identification commands having values that are modified according to the positions at which the through-wires are arranged. Here, the various command reception units 181 of the slave devices receive the identification commands shown in the aforementioned FIG. 5. In more specific terms, the first CS terminal 111a of the first slave device 110 receives the first bit "0" of the identification command (0, 0, 0) from the first CS terminal 101b of the master device 100. Likewise, the second CS terminal 113a and the third CS terminal 115a of the first slave device 110 receive the second bit "0" and the third bit "0" of the identification command (0,0,0) from the second CS terminal 103b and the third CS terminal 105b, respectively. Consequently, the command reception unit 181 of the first slave device 110 receives the identification command (0, 0, 0).

As described above, the first CS terminals 111a and 111b of the first slave device 110 are not connected by a through-wire, and therefore the first bit "0" of the identification command (0, 0, 0) does not reach the first CS terminal 121a of the second slave device 120. Accordingly, the first CS terminal 121a remains clamped at the first potential "1". Meanwhile, the second bit "0" and the third bit "0" of the identification command (0, 0, 0) are transmitted to the second CS terminal 123a and 125a of the second slave device 120 via the through-wires 151 and 153. Accordingly, the command reception unit 181 of the second slave device 120 receives the identification command (1, 0, 0).

Furthermore, the first CS terminals 111a and 111b of the first slave device 110 are not connected by a through-wire, and therefore the first bit "0" of the identification command (0, 0, 0) does not reach the first CS terminal 131a of the third slave device 130. Likewise, the second CS terminals 123a and 123b of the second slave device 120 are not connected by a through-wire, and therefore the second bit "0" of the identification command (0, 0, 0) does not reach the second CS terminal 133a of the third slave device 130. Accordingly, the first CS terminal 131a and the second CS terminal 133a remain clamped at the first potential "1". Meanwhile, the third bit "0" of the identification command (0, 0, 0) is transmitted to the third CS terminal 135a of the third slave device 130 via the through-wire 153, the through-wire 155 and the third CS terminal 125b. Accordingly, the command reception unit 181 of the third slave device 130 receives the identification command (1, 1, 0).

Next, the slave device ID setting units 182 set slave device specific IDs on the basis of the respective identification commands (0, 0, 0), (1, 0, 0) and (1, 1, 0). The ID storage unit 183 stores the IDs set by the ID setting units 182.

In the foregoing, the slave device ID setting unit 182 sets the IDs on the basis of the identification command. However, the ID setting unit 182 may recognize a select signal line serving to place the slave device in the selected state, based on the identification command. For example, the slave devices can be identified on the basis of the most significant bit outputting a "0" in the identification command. The first slave device 110 receives the identification command (0, 0, 0) and the most significant bit outputting a "0" is the first bit of the identification command. Accordingly, the ID setting unit 182 of the first slave device recognizes the first CS terminal 111a as the select signal line, and if this first CS terminal 111a goes "0", it recognizes that the device to which it belongs has been selected. Furthermore, the second slave device 120 receives the identification command (1, 0, 0), and the most significant bit outputting a "0" is the second bit of the identification command. Accordingly, the ID setting unit 182 of the second slave device recognizes the second CS terminal 123a as the select signal line, and if this second CS terminal 123a goes "0", it recognizes that the device to which it belongs has been selected. Likewise, the third slave device 130 receives the identification command (1, 1, 0) and the most significant bit outputting a "0" is the third bit of the identification command. Accordingly, the ID setting unit 182 of the third slave device recognizes the third CS terminal 135a as the select signal line, and if this third CS terminal 135a goes "0", it recognizes that the device to which it belongs has been selected Various Control Processing by the Slave Devices In order for the select signal transmission unit 191 of the master device 100 to access one of the stacked slave devices having an identical terminal configuration, the ID of the slave device to be accessed is retrieved from the correspondence storage unit 190. Next, the select signal transmission unit 191 generates a select signal including the retrieved ID and transmits this to the select signal receiving units 184 of the slave devices. Consequently, the slave device having the ID in question enters the selected state, in which execution of various controls is possible. Next, the control signal reception unit 185 of the slave device in question receives control signals from the master device. The slave device in question executes various types of processing on the basis of these control signals.

Operative Effect

By providing a constitution of this sort, the identification command sent by the master device takes the form of different information at each slave device when it is received by each of the slave device. The slave device ID setting unit sets a slave device specific ID for each slave device in response to differing identification commands.

Accordingly, even when the terminals of slave devices having identical terminal configurations are interconnected via through-wires, the master device can access each slave device by the IDs that have been set. For example, first the master device selects the slave device to be controlled on the basis of the ID and places that slave device in the selected state. Thereafter, this slave device is controlled in various ways by sending commands thereto. Here, the ID may, for example, be information for identifying a select signal line for uniquely accessing each of the slave devices. By setting an individual select signal line for each slave device, it is possible to uniquely place each of the slave devices in the selected state.

Furthermore, because the through-wires interconnect corresponding terminals with identical terminal structures, the through-wires can be formed perpendicular to the slave device. Accordingly, complicated manufacturing processes such as forming the through-wires at an inclined angle with respect to the slave device are not necessary, so the stacked device can be manufactured easily.

Furthermore, the stacked device can be manufactured by stacking the slave devices to which IDs have not yet been assigned, and then assigning the ID when the stacked device is initialized, as described above. After initialization is complete, the master device accesses each of the slave devices on the basis of the IDs that have been set. Thus, even if the slave devices do not have IDs before being used to construct the stacked device, the IDs can be set after manufacturing the stacked device. In other words, there is no need to assign an ID to each slave device before manufacturing the stacked device. Accordingly, there is no need to assign an ID in each slave device when large numbers of slave devices are manufactured as chips on a wafer. Consequently, it is possible to eliminate the difficulty of managing each slave device according to the ID after dicing. For example, there is no need for difficult operations such as selecting slave devices according to IDs from amongst a large number of slave devices that have been diced from a wafer.

Furthermore, each slave device receives an identification command according to the connection configuration of the through-wires after stacking. Thus, because the ID of the slave device is set in response to this identification command, there is no need to give special consideration to the stacking order or stacking method when stacking the slave devices. Accordingly, it is, for example, possible to stack the slave devices in a freely chosen manner, allowing the stacked device to be easily manufactured.

Furthermore, the CS terminals of the slave devices, to which the identification commands are input, are interconnected via the through-wires. In other words, there is no need for dedicated CS terminals for each slave device for the purpose of receiving the identification commands. Furthermore, because the identification command is modified by passing through each slave device, there is no need to input slave device specific identification commands for each slave device.

Figure 6:
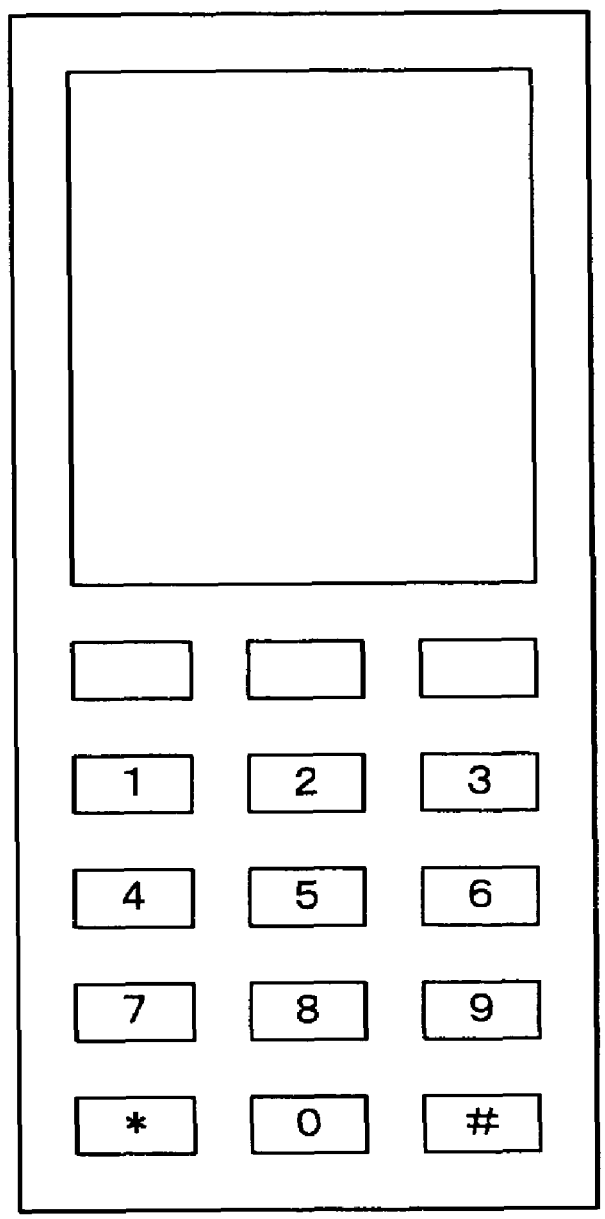
FIG. 6 shows one example of a portable telephone.

Examples of products equipped with a stacked device according to the first embodiment described above include the portable telephone shown in FIG. 6, portable computers, PDAs, portable television receivers, portable audio players, car navigation systems, and the like.

Variant 1 of the First Embodiment

Figure 7:
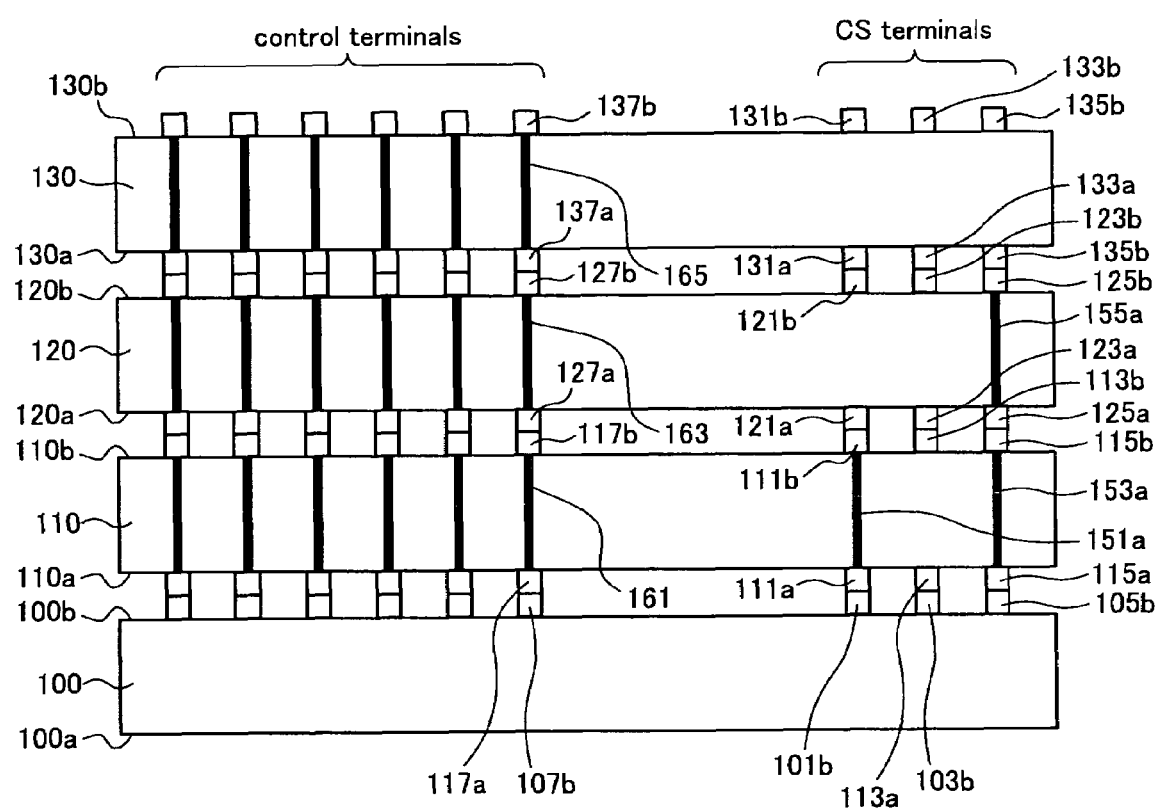
FIG. 7 is a schematic sectional view of a stacked device according to another aspect of the first mode of embodiment.

In the first embodiment described above, a case in which the through-wires were arranged as shown in FIG. 3 was described. However, the positions at which the through-wires are arranged are not limited to the positions shown in FIG. 3, so long as the slave devices can receive identification commands having differing values via the through-wires. For example, as shown in FIG. 7, the first slave device 110 may be provided with through-wires 151a and the 153a, and the second slave device 120 may be provided with a through-wire 155a. In specific terms, the first CS terminals 111a and 111b of the first slave device 110 are connected by the through-wire 151a. Furthermore, the third CS terminals 115a and 115b of the first slave device 110 are connected by the through-wire 153a. Furthermore, the third CS terminals 125a and 125b of the second slave device 120 are connected by the through-wire 155a.

Here, if an identification command is input from the first through third CS terminals 101b, 103b and 105b, the identification commands received by the slave devices are as follows. The first through third CS terminals 111a, 113a and 115a of the first slave device 110 receive the identification command as the unmodified identification command (0, 0, 0). Furthermore, the first CS terminal 121a and the third CS terminal 125a of the second slave device 120 receive the first bit "0" and the third bit "0" of the identification command (0, 0, 0) via the through-wire 151a and the through-wire 153a, respectively. Meanwhile, the second CS terminals 113a and 113b of the first slave device 110 are not connected by a through-wire, and therefore the second CS terminal 123a of the second slave device 120 remains clamped at the first potential. Consequently, the command reception unit 181 of the second slave device 120 receives the identification command (0, 1, 0). Likewise, the second CS terminals 123a and 123b of the second slave device 120 are not connected by a through-wire. Accordingly, the command reception unit 181 of the third slave device 130 receives the identification command (1, 1, 0).

Thus, the slave device ID setting units 182 set slave device specific IDs on the basis of the respective identification commands (0, 0, 0), (0, 1, 0) and (1, 1, 0).

Other

Furthermore, in the foregoing, the identification command was (0, 0, 0), but the identification command may also be (1, 1, 1). Furthermore, the first potential to which the CS terminals are clamped may also be "0". In this case, the values in the identification command in the aforementioned FIG. 7 would be such that the "1" are replaced by "0", and in the "0" are replaces by "1".

Furthermore, in the foregoing, terminals were provided on both sides of the slave devices and the master device, but a configuration is also possible wherein the terminals are provided only on one side, so long as the terminals are interconnected via through-wires.

Second Embodiment

Configuration of the Stacked Device
(1) Overall Configuration
The terminals of the master device and the slave devices have identical terminal arrangements, as shown in FIG. 1A and FIG. 1B of the first embodiment.

Figure 8:
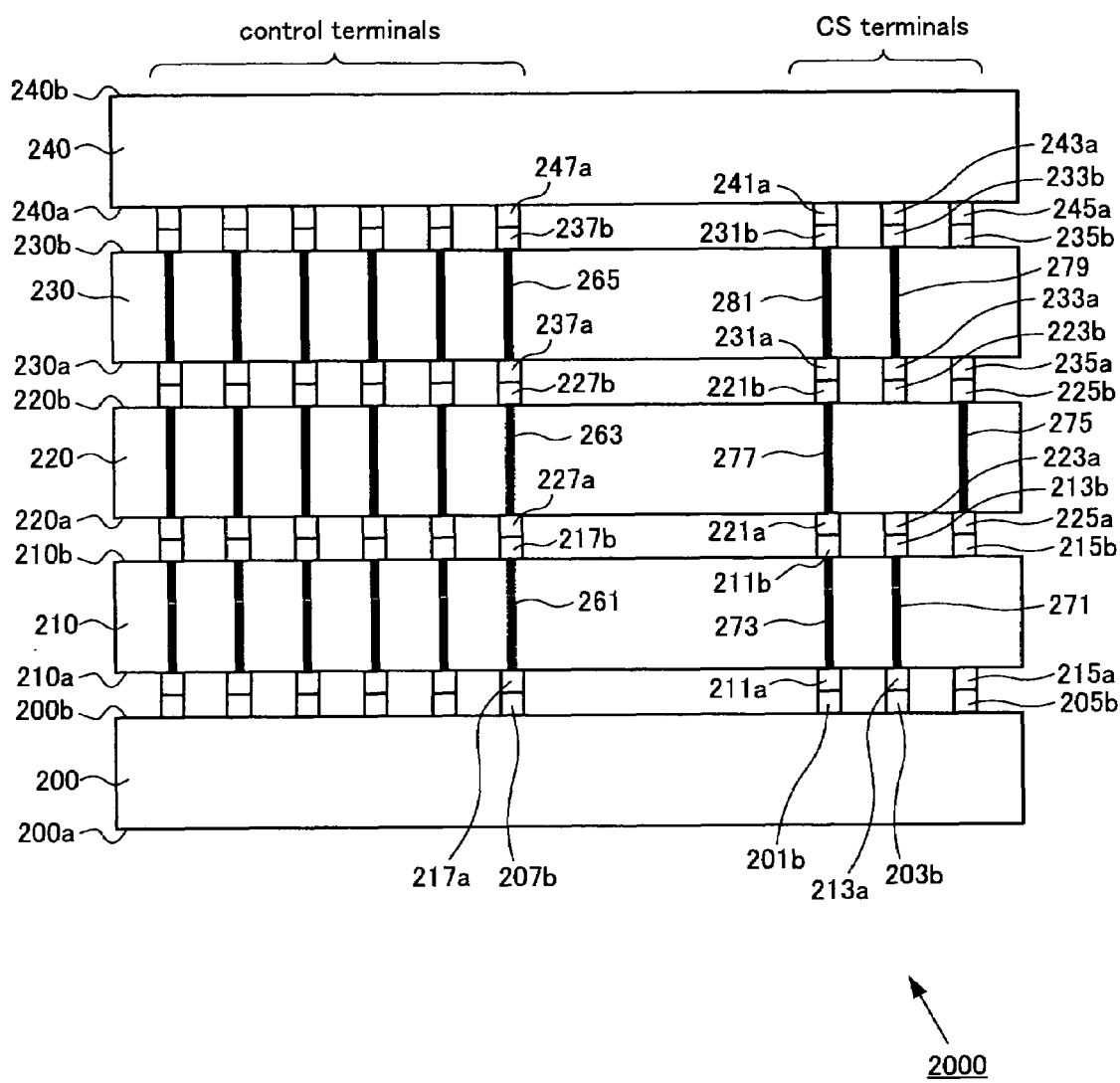
FIG. 8 is a schematic sectional view of a stacked device according to a second mode of embodiment.

FIG. 8 is a sectional structural view of a stacked device according to the second embodiment. A stacked device 2000 comprises a stack of: a master device 200; a first slave device 210; a second slave device 220; a third slave device 230; and a fourth slave device 240. Furthermore, the terminals comprise a plurality of control terminals, to which are input control signals in order to perform various types of processing in the slave devices, and a plurality of CS terminals, to which are input identification commands from the master device 200. Here, an example is shown wherein four slave devices are stacked, but there is no limit on the number of layers in the stack.

(2) Configuration of the CS Terminals and Configuration of the CS Terminal Connections Via Through-Wires A third CS terminal 205b, on a front side 200b of the master device 200, is a CS terminal for transmitting an identification command from the master device 200 to the slave devices that are stacked thereupon. Furthermore, through-wires 271, 275 and 279, which are provided in the slave devices, are through-wires for transmitting identification commands from the master device and for transmitting commands from underlying slave devices to overlying slave devices. Furthermore, the through-wires 271, 275 and 279 are arranged in alternating positions in each of the slave devices. Consequently, commands input to the CS terminals for which through-wires are formed, are transmitted to the overlying slave devices. Meanwhile, commands input to CS terminals for which through-wires are not formed are not transmitted to overlying slave devices. Here, the term "through-wires" refers to wires that pass through the slave devices on the substrates, and which are formed substantially perpendicular to the principal sides of the substrates.

Meanwhile, the through-wires 273, 277 and 281 are through-wires for transmitting a completion notification, which indicates that identification ID setting has been completed by the slave devices, to the master device 200 from the slave devices. Furthermore, the through-wires 273, 277 and 281 interconnect CS terminals in the same positions in the first through fourth slave devices. Specifically, the configuration of the CS terminals and the through-wires is as described below.

The second CS terminal 213a, on the back side 210a of the first slave device 210, and the second CS terminal 213b, on the front side 210b thereof, are connected by the through-wire 271. The third CS terminal 225a, on the back side 220a of the second slave device 220, is connected to the third CS terminal 225b, on the front side 220b thereof, by the through-wire 275. The second CS terminal 233a, on the back side 230a of the third slave terminal 230, is connected to the second CS terminal 233b, on the front side 230b thereof, by the through-wire 279. Thus, the second CS terminals of the slave devices and the third CS terminals of the slave devices are interconnected by through-wires that are alternatively arranged at each slave device.

Furthermore, the first CS terminal 211a, on the back side 210a of the first slave device 210, is connected to the first CS terminal 211b, on the front side 210b thereof, by the through-wire 273. The first CS terminal 221a, on the back side 220a of the second slave device 220, is connected to the first CS terminal 221b, on the front side 220b thereof, by the through-wire 277. Furthermore, the first CS terminal 231a, on the back side 230a of the third slave device 230, is connected to the first CS terminal 231b, on the front side 230b thereof, by the through-wire 281. Thus, the first CS terminals of all of the slave devices are interconnected by through-wires.

Note that the identically positioned terminals contact each other as a result of stacking the slave devices and the master device. Furthermore, before the identification command is input from the master device 200, the CS terminals are clamped at a predetermined potential, such as source or ground (hereinafter referred to as the first potential, and represented by "1").

(3) Configuration of the Control Terminals and Configuration of the Control Terminal Connections Via Through-Wires The control terminals of each slave device have identical terminal arrangements, and the respectively corresponding control terminals are connected via through-wires. The expression, "identical terminal configurations" means that the arrangements of terminals such as, for example, address terminals and read/write terminals are identical. Thus, as the terminal arrangements are identical, signals having identical functions are transmitted to the slave devices from the master device 200.

The control terminals are connected as shown in FIG. 8. Accordingly, for example, the control signal from the control terminal 207b of the master device 200 is transmitted to a slave device that was selected by the select signal, by way of the control terminal 217a, the through-wire 261, the control terminals 217b and 227a, the through-wire 263, the control terminals 227b and 237a, the through-wire 265 and the control terminals 237b and 247a.

Overview of ID Setting Method

Figure 9:
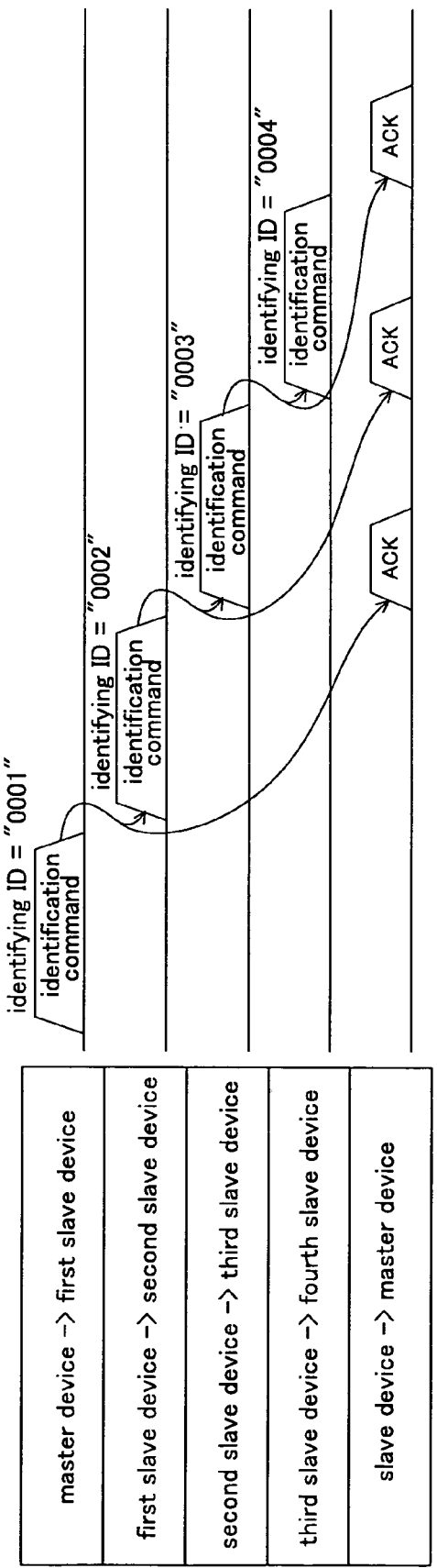
FIG. 9 is a timing chart showing an overview of a method for setting IDs in the stacked device shown in FIG. 8

FIG. 9 is a timing chart showing an overview of a method for setting IDs in the stacked device shown in FIG. 8

The master device 200 sends an identification command to the first slave device 210. At this time, the identification command includes ID "0001" for setting the first slave device 210. The first slave device 210 sets the ID of the slave device to "0001" on the basis of this identification command. Next, the first slave device 210 generates a command for setting the ID of the second slave device 220, and sends this to the second slave device 220. At this time, the generated command includes the ID "0002" that will be set by the second slave device 220. Next, slave device IDs are generated to serve as specific IDs for all of the slave devices in the stack. Here, as one example, a slave device increments its own ID by one, so as to generate the ID for the next slave device. When the first slave device 210 has completed setting the ID, it sends an "ACK" response, indicating that this has been completed, to the master device 200.

Next, the second slave device 220 receives an ID "0002" together with the command and sets its own ID as "0002". Likewise, a command is generated for setting the ID of the third slave device 230, which is sent to the third slave device 230. Here, the command that is generated contains the ID "0003". Then, upon completion of setting its own ID, the second slave device 220 sends an "ACK" response to the master device 200.

The processing described above is repeated until each of the slave devices in the stack have completed setting the ID.

Functional Configuration

Figure 10:
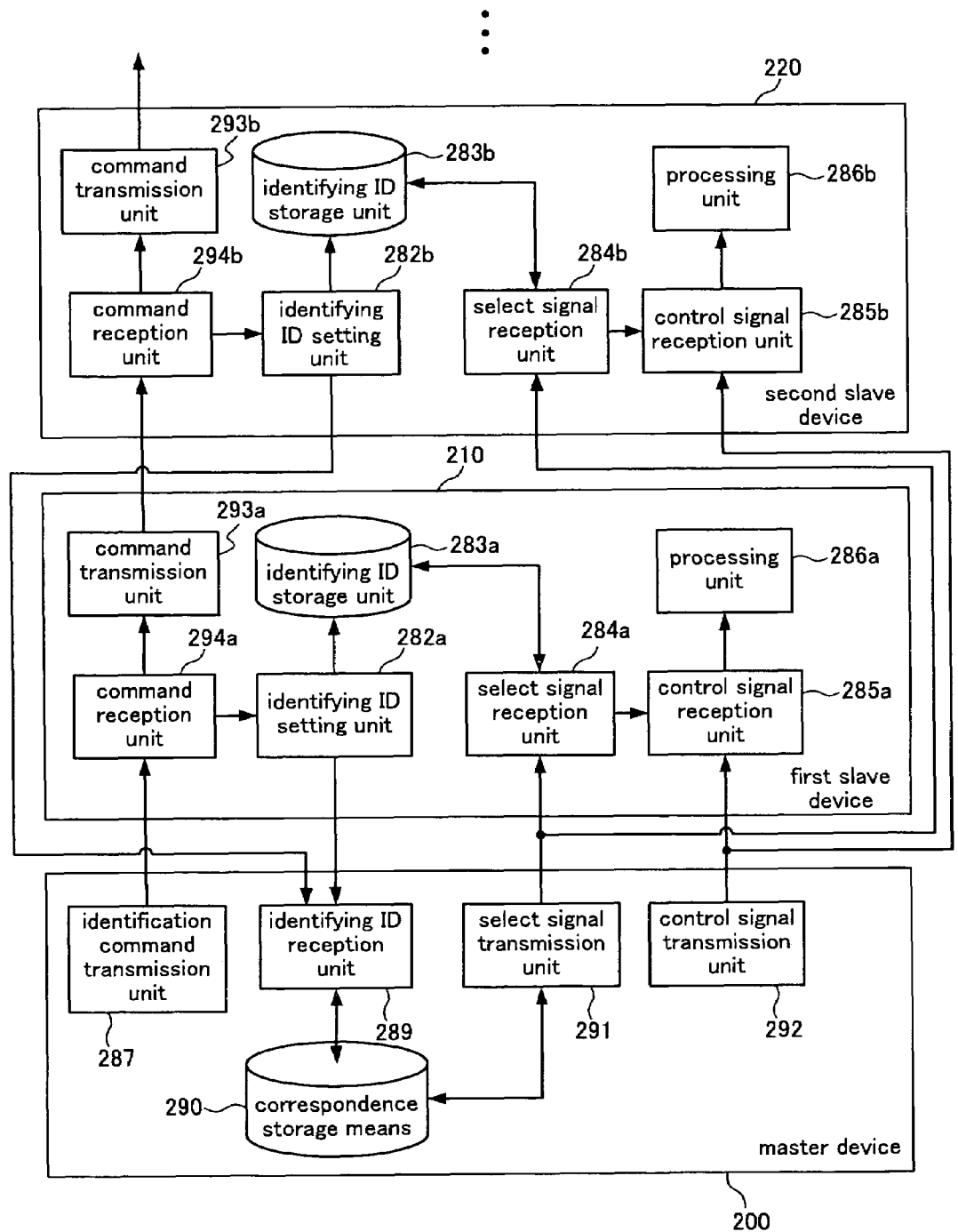
FIG. 10 is a functional block diagram of a master device and slave devices.

Next, the functional configuration of the master device and the slave devices, for setting the IDs, is explained. FIG. 10 is a functional block diagram of the master device and the slave devices. Note that, FIG. 10 shows only the functional configuration of the first slave device 210 and the second slave device 220, but the other slave devices have the same functional configurations.

(1) Master Device

The master device 200 comprises: an identification command transmission unit 287; an ID reception unit 289; a correspondence storage unit 290; a select signal transmission unit 291; and a control signal transmission unit 292. The identification command transmission unit 287 generates an identification command and sends the identification command to the first slave device 210 via the third CS terminal 205*b*.

The ID reception unit 289 receives slave device specific IDs set by the slave devices and completion notification indicating that setting of the IDs has been completed. Note that reception of the ID may be considered reception of the completion notification. The correspondence storage unit 290 stores the received IDs in correspondence with the slave devices.

Note that the ID reception unit 289 may receive a completion notification that includes the stack layer number and may acquire the slave device ID on the basis of the stack layer number. In other words, the slave device command reception unit 293, described hereinbelow, increments the stack layer number each time the command passes through a slave device, and sends that count value to the master device 200 as the stack layer number. Here, the command reception units 293 of the slave devices set the ID of the slave device stacked thereupon by a predetermined method. In this case, the ID reception unit 289 of the master device may determine the IDs of the slave devices based on the received stack layer number and a predetermined ID setting method. For example, the ID reception unit 289 may consider receiving a stack layer number of 5 as having received completion notification from the topmost slave device. Next, the command reception units 293 of the slave devices increment their own IDs by one, and set the ID of the slave device above their own device. In this case, even if the ID reception unit 289 does not receive an ID from the slave devices, it can recognize that the IDs are "0001", "0002", "0003", "0004", and "0005", in order of their proximity to the master device, on the basis of the stack layer number 5.

The select signal transmission unit 291 transmits a select signal to the slave device in question so as to place that slave device in the selected state, allowing the necessary processing to be performed. At this time, the select signal is generated by the select signal transmission unit 291 on the basis of the ID stored in the correspondence storage unit 290, and select signal is transmitted to the slave device in question. Next, the control signal transmission unit 292 transmits control signals for the purpose of performing various controls on the slave device that has been placed in the selected state. Consequently, the master device is capable of executing the desired processing in this slave device alone.

(2) Functional Configuration of the Slave Device

Each slave device comprises: an ID setting unit 282, an ID storage unit 283, a select signal reception unit 284; a control signal reception unit 285; a processing unit 286; a command transmission unit 293; and a command reception unit 294.

The command reception unit 294 receives identification commands from the master device or the underlying slave devices. The command reception unit 294*a* of the first slave device 210 receives identification commands via the third CS terminal 205*b* of the master device 200 and the third CS terminal 215*a* of the first slave device 210. Here, "0" is input as the identification command. Furthermore, the identification command to the first slave device 210 includes the ID "0001". Here, before the identification command is input, the third CS terminal 215*a* is clamped at the first potential "1". Accordingly, the third CS terminal 215*a* is changed from that potential "1" to "0" as a result of receiving the identification command "0". The command reception unit 294 receives an ID included in that identification command on the basis of this change.

The command transmission unit 293 generates the ID for the overlying slave device on the basis of the ID that was received by the command reception unit 294. Next, a command including the generated ID is generated, and sent to the command receiving unit 293 of the overlying slave device. ID generation is not limited to this method, so long as the IDs of the slave devices in the stack are different.

The ID setting unit 282 sets the ID of the device to which it belongs on the basis of the ID received. The ID storage unit 283 stores the ID that has been set for the device to which it belongs. Furthermore, when the ID setting unit 282 completes setting the ID, it generates a completion notification "ACK" and transmits this to the ID reception unit 289 of the master device 200. Consequently, if the master device 200 does not receive a completion notification "ACK" from the slave device after a predetermined period of time following identification command transmission, it determines that the ID setting is complete in the slave devices. The number of slave devices in the stack can be changed according to the functions required of the product, and this is not fixed data, thus the master device 200 does not know the number of slave devices in the stack. As a result, the master device can reduce time wasted in waiting for setting completion by receiving notification that ID setting has been completed in the slave devices. Furthermore, the master device can move to subsequent operations at the same time as completion notification "ACK".

The select signal reception unit 284 receives a select signal which, for example, includes an ID, from the select signal transmission unit 291 of the master device. Furthermore, the select signal reception unit 284 compares the ID in the ID storage unit 283 and the ID contained in the select signal, so as to determine whether or not the device to which it belongs has been selected. Here, if the device to which it belongs has been selected, the select signal reception unit 284 instructs the control signal reception unit 285 to receive control signals from the master unit 200. In response to this instruction, the control signal reception unit 285 receives control signals from the control signal transmission unit 292 of the master device 200, via the control terminals.

The processing unit 286 processes control signals received by the control signal reception unit 285 and performs various types of control.

Processing For Setting the IDs

Figure 11:
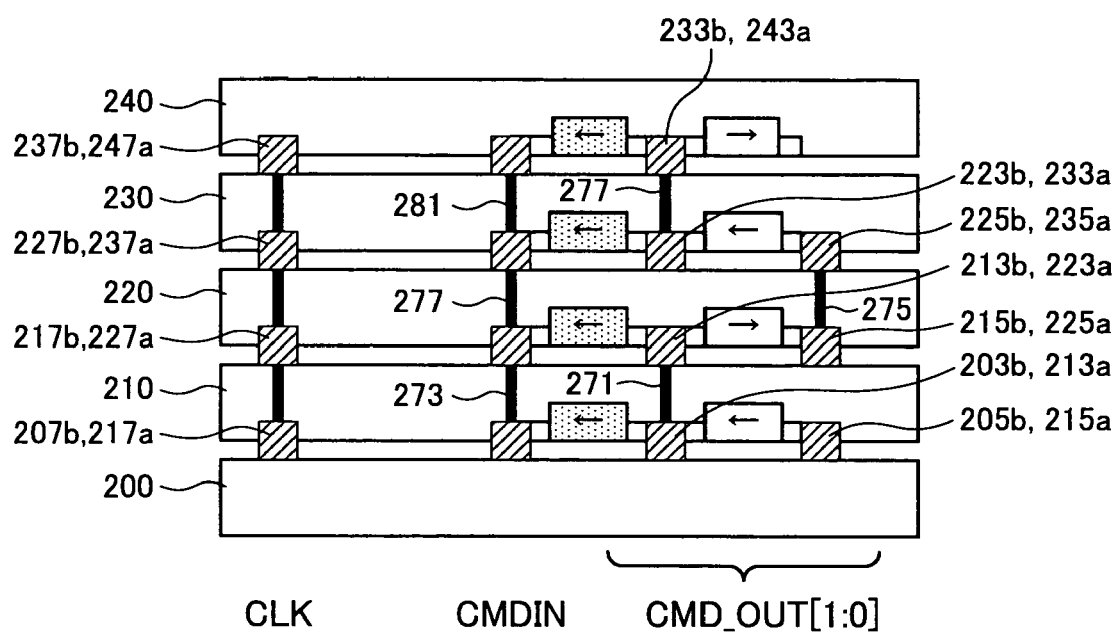
FIG. 11 is a schematic view showing an overview of a method for setting IDs in the stacked device shown in FIG. 8

FIG. 11 is a schematic view showing an overview of a method for setting IDs in the stacked device shown in FIG. 8. The ID setting process will be described in conjunction with the slave device functional block diagram shown in the aforementioned FIG. 10.

The identification command transmission unit 287 of the master device 200 transmits identification commands to the first slave device 210 via the third CS terminals 205*b* of the master device 200 and the third CS terminal 215*a* of the first slave device 210.

The command reception unit 294*a* of the first slave device 210 receives identification commands from the master device 200. Here, because a through-wire is not formed at the third CS terminal 215*a*, the identification command is not transmitted to the second device 210 without modification. Next, the ID setting unit 282*a* of the first slave device 210 sends the specific ID for the device to which it belongs on the basis of the identification command received. For example, if the identification command contains "0001" as the ID of the first slave device 210, the ID setting unit 282*a* sets this ID "0001" in the first slave device 210. Here, when the ID setting unit 282*a* sets the ID in the device to which it belongs, a completion notification "ACK" is generated, which indicates that the setting of the ID has been completed. Next, the ID setting unit 282a sends the completion notification "ACK", together with the ID "0001" of the device to which it belongs, to the ID reception unit 289a of the master device 200. Here, the completion notification "ACK" and the ID "0001" are sent to the master device 200 via the through-wire 273.

Next, the command transmission unit 293a of the first slave device 210 generates a command allowing the second slave device 220 to set a specific ID. For example, the command transmission unit 293a generates the command on the basis of an ID wherein the ID of the device to which it belongs has been incremented by one. This generates a command including an ID "0002", wherein the ID "0001" of the first slave device has been incremented by one. Next, the command transmission unit 293a conveys the command generated, to the second CS terminal 213a, in the direction of the arrow in the first slave device 210 shown in FIG. 11. Consequently, the generated command is transmitted to the second CS terminal 223a of the second slave device 220 via the through-wire 271 that connects the second CS terminal 213a and the second CS terminal 213b.

The command reception unit 294b of the second slave device 220 receives the command from the first slave device 210 by way of the second CS terminal 223a. Here, because a through-wire is not formed at the second CS terminal 223a, the identification command is not transmitted to the third device 210 without modification. The ID setting unit 282b sets "0002" as the ID for the device to which it belongs, on the basis of the received command. Next, the ID setting unit 282b transmits the completion notification "ACK", together with the ID "0002" of the device to which it belongs, to the ID reception unit 289 of the master device 200. Here, the completion notification "ACK" and the ID "0002" are sent to the master device 200 via the through-wire 277 and the through-wire 273.

Furthermore, the command transmission unit 293b of the second slave device 220 generates a command on the basis of an ID "0003" by incrementing the ID "0002" by one. Next, the command transmission unit 293b conveys the command generated to the third CS terminal 225a in the direction of the arrow in the second slave device 210 shown in FIG. 11. Consequently, the generated command is transmitted to the third CS terminal 235a of the third slave device 230 via the through-wire 275 that connects the third CS terminal 225a and the third CS terminal 225b of the second slave device 220.

In this manner, the specific ID of the slave device can be set on the basis of the identification command received from the master device 200 and the identification commands received from the underlying slave devices.

Various Control Processing by the Slave Devices

In order for the select signal transmission unit 291 of the master device 200 to access a stacked slave device having the same terminal configuration, the ID of the slave device to be accessed is retrieved from the correspondence storage unit 290. Next, the select signal transmission unit 291 generates a select signal including the retrieved ID and transmits this to the select signal receiving units 284 of the slave devices. Consequently, the slave device having the ID in question enters the selected state, in which execution of various controls is possible. Next, the control signal reception unit 285 of the slave device in question receives control signals from the master device. The slave device in question executes various types of processing on the basis of these control signals.

Operative Effect

Each slave device modifies the received identification command and outputs it to an adjacent slave device. Accordingly, the slave devices receive specific identification commands and can set the slave device specific ID on the basis of that specific identification command. Accordingly, even if a plurality of slave devices are stacked in a stacked device, the master device can identify each slave device. For example, the master device selects the slave device to be controlled on the basis of the ID, and places that slave device in the selected state. Thereafter, this slave device can be controlled in various ways by sending commands thereto. Otherwise, the same operative effect as in the first embodiment can be achieved.

Variant 1 of the Second Embodiment

Figure 12:
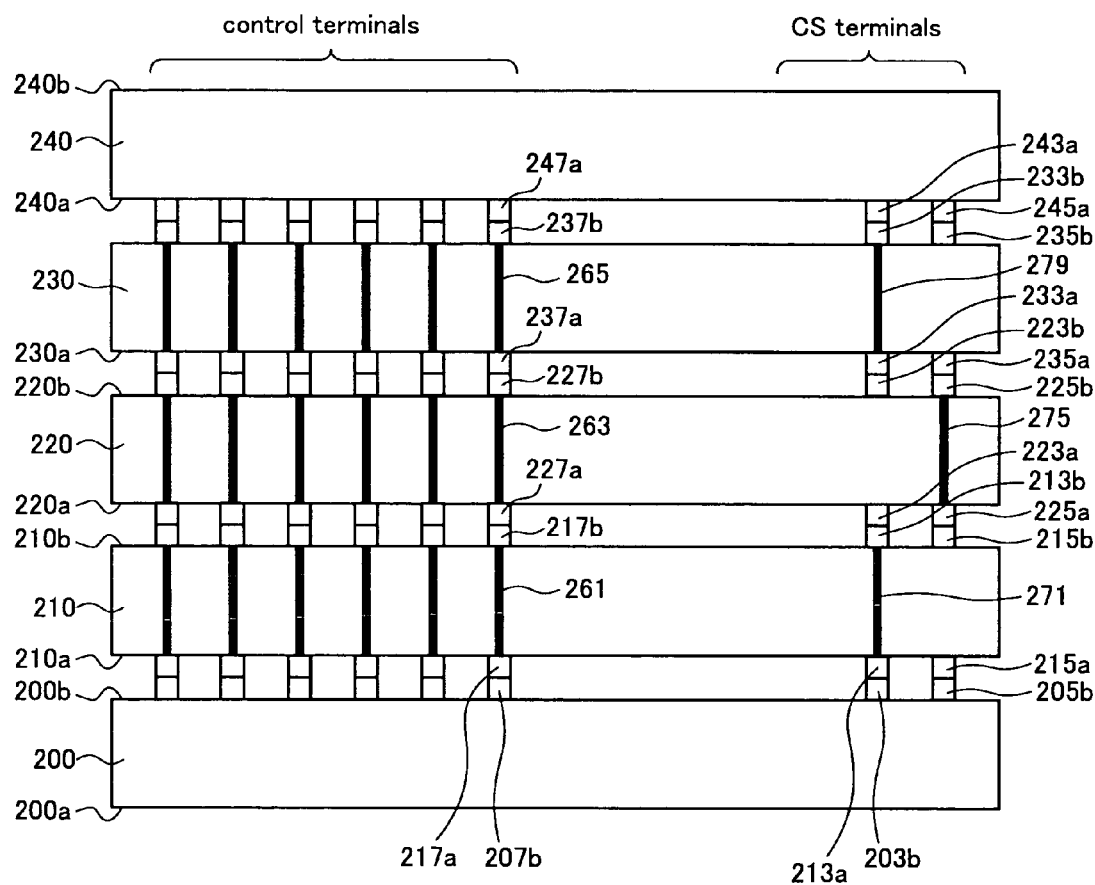
FIG. 12 is a schematic sectional view of a stacked device according to another aspect of second mode of embodiment.

In the second embodiment described above, ID setting processing was terminated by the master device 200 receiving completion notifications "ACK" from the slave devices. However, ID setting processing may also end after a certain period of time has expired. For example, the master device 200 may separately store the number of slave device layers in the stack beforehand. Then, the master device 200 may terminate ID setting processing when a period of time has expired which is sufficient to set the IDs for the number of slave devices in the stack. In such cases, it is not necessary for the slave devices to send a completion notification "ACK" to the master device 200. Accordingly, a configuration such as that shown in FIG. 12 is possible. FIG. 12 is a sectional structural view of a stacked device according to another aspect of the second embodiment. The difference between the configuration shown in FIG. 12 and that shown in FIG. 8 is that it is not necessary to provide through-wires 273, 277 and 281 for transmitting the completion notification "ACK". Other than that, the configuration is the same as shown in FIG. 8, and description that which is identical shall be omitted.

Variant 2 of the Second Embodiment

Figure 13:
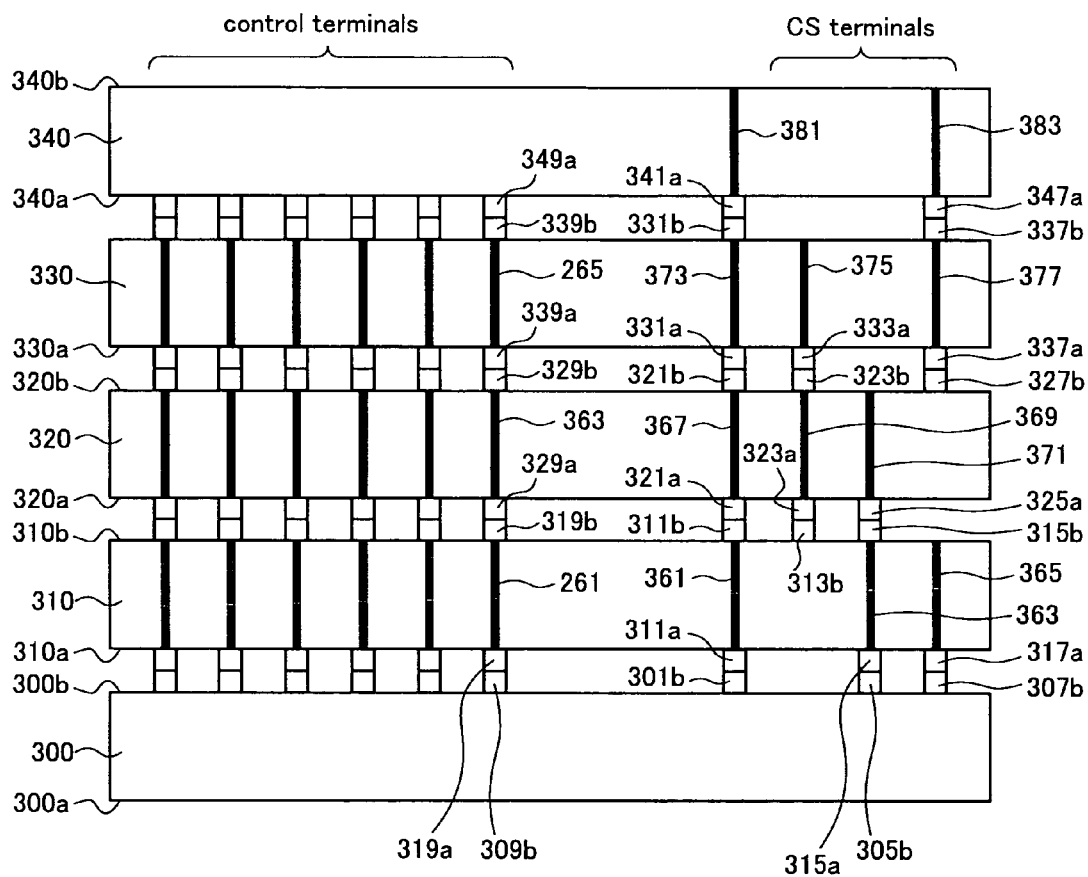
FIG. 13 is a schematic sectional view of a stacked device according to another aspect of second mode of embodiment.

FIG. 13 is a sectional structural view of a stacked device according to another aspect of the second embodiment. With the configuration of the second embodiment described above, with reference to FIG. 8 and FIG. 11, a through-wire was not, for example, formed at the third CS terminal 215a of the first slave device. That is to say, even if a third CS terminal 215a is formed on the back side 210a of the first slave device 210, it is not absolutely necessary that a through-wire be formed at this third CS terminal 215a. However, in FIG. 13, CS terminals are formed on the back side of the slave devices, and through-wires are formed together with those CS terminals. For example, the first slave device 310 comprises a first CS terminal 311a, a third CS terminal 315a and a fourth CS terminal 317a on the back side 310a thereof. Next, a through-wire 361 is provided at the first CS terminal 311a; a through-wire 363 is provided at the third CS terminal 315a, and a through-wire 365 is provided at the fourth CS terminal 317a. Likewise, the second slave device 320 comprises a first CS terminal 321a, a second CS terminal 323a and a third CS terminal 325a on the back side 320a thereof. Next, a through-wire 367 is provided at the first CS terminal 321a; a through-wire 369 is provided at the second CS terminal 323a, and a through-wire 371 is provided at the third CS terminal 325a. If such terminals and through-wires are formed together, it is possible for each slave device to set the ID by stacking the slave devices as shown in FIG. 13.

Figure 14:
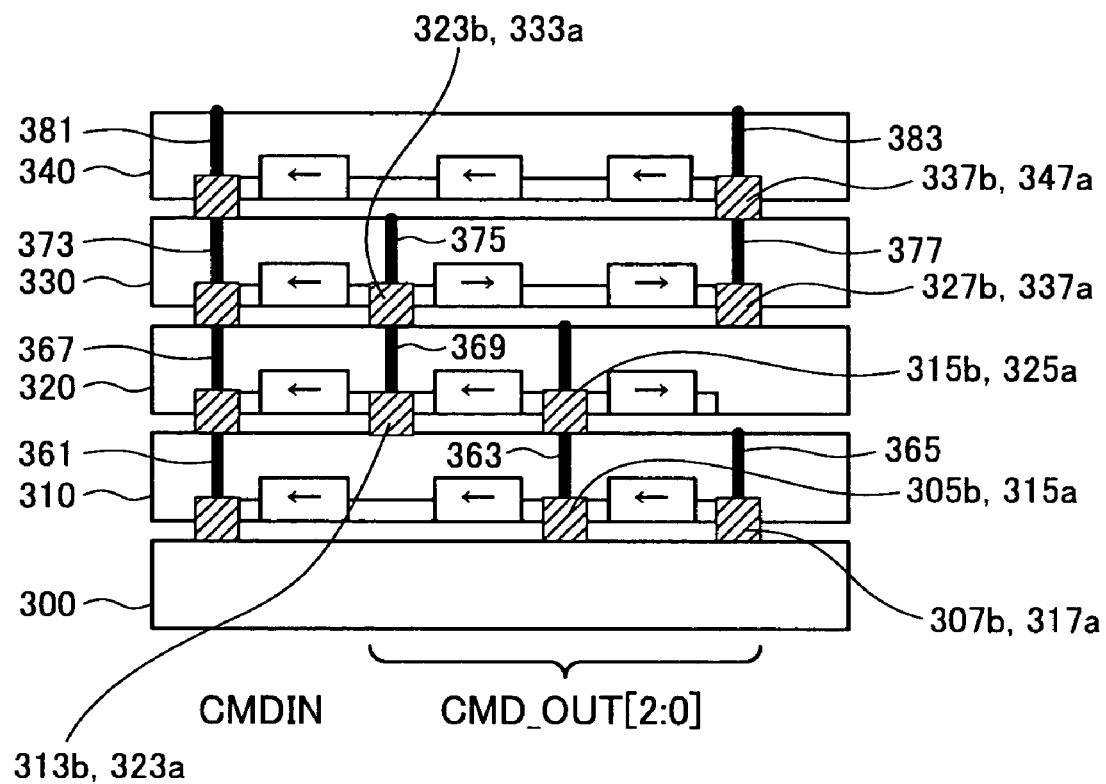
FIG. 14 is a schematic view showing an overview of a method for setting IDs in the stacked device shown in FIG. 13

FIG. 14 is a schematic view showing an overview of a method for setting IDs in the stacked device shown in FIG. 13. The functional configuration of the master device and the slave devices is the same as that described above with reference to FIG. 10, and therefore the configuration in FIG. 13 will be described with reference to FIG. 14 and FIG. 10.

The command transmission unit 387 of the master device 300 transmits identification commands to the first slave device 310 via the fourth CS terminal 307b of the master device 300 and the fourth CS terminal 317a of the first slave device 310.

The command reception unit 294a of the first slave device 310 receives identification commands from the master device 300. Here, a through-wire 365 is formed at the fourth CS terminal 317a, but the through-wire 365 is not connected with the overlying second slave device 320. Accordingly, the identification command is not transmitted without modification to the second slave device 320. Next, the ID setting unit 282a of the first slave device 310 sets the ID for the device to which it belongs on the basis of the identification command received. Here, the ID setting unit 282a transmits the completion notification "ACK" together with the ID "0001" of the device to which it belongs to the ID reception unit 289 of the master device 300. Here, the completion notification "ACK" and the ID "0001" are sent to the master device 300 via the through-wire 361.

Next, the command transmission unit 293a of the first slave device 310 generates a command allowing the second slave device 320 to set a specific ID. Next, the command transmission unit 293a conveys the command that was generated to the third CS terminal 315a in the direction of the arrow in the first slave device 310 shown in FIG. 14. Consequently, the generated command is transmitted to the third CS terminal 325a of the second slave device 320 via the through-wire 363 that connects the third CS terminal 315a and the third CS terminal 315b.

The command reception unit 294b of the second slave device 320 receives the command from the first slave device 310 by way of the third CS terminal 325a. Here, a through-wire 371 is formed at the third CS terminal 325a, but the through-wire 371 is not connected with the overlying third slave device 330. Accordingly, the command generated by the first slave device 310 is not transmitted to the third slave device 330 without modification. Next, the ID setting unit 282a of the second slave device 320 sets the specific ID in the device to which it belongs on the basis of the received command and transmits the completion notification "ACK" and the ID to the master device 300 via the through-wire 367 and the through-wire 361.

Moreover, the command transmission unit 293b of the second slave device 320 generates a command in the same manner. Next, the command transmission unit 293b conveys the command generated to the second CS terminal 323a in the direction of the arrow in the second slave device 320 shown in FIG. 14. Consequently, the generated command is transmitted to the third CS terminal 333a of the third slave device 330 via the through-wire 369 that connects the second CS terminal 323a and the second CS terminal 323b of the second slave device 320.

The processing described above is repeated until each of the slave devices in the stack have completed setting of the IDs. Consequently, a specific ID can be set in the device to which it belongs on the basis of the command received from the master device 300 and the command received from the underlying slave device.

Other

In the foregoing, terminals were provided on both sides of the slave devices and the master device, but a configuration is also possible wherein the terminals are provided only on one side, so long as the terminals are interconnected via through-wires.

Third Embodiment

Summary

The stacked device comprises a stack of a master device and a plurality of slave devices having identical terminal arrangements. Here, the master device comprises: a command transmission unit for inputting a random number generation command for starting random number generation; a determination unit for receiving random numbers generated by the slave devices and determining whether or not the values of the random numbers are different from each other; an ID reception unit for receiving, from the slave devices, the IDs of the slave devices that were set in response to the random number generation command; and a correspondence storage unit for storing the correspondences between the slave devices and the IDs. Furthermore, each slave device comprises: a through-wire for interconnecting at least one terminal of the slave device and an adjacent slave device; a command reception unit for receiving the random number generation command; a random number generation unit for generating a random number in response to the random number generation command and transmitting the generated random number to the master device; an ID setting unit for setting an ID for that same device in accordance with the determination result from the determination unit of the master device.

With a configuration of this sort, the master device receives random numbers generated internally by the slave devices and determines whether or not all of these random numbers are different from each other. If all of the generated random numbers are different, the slave devices set the specific IDs on the basis of the random numbers generated by each slave device. Accordingly, even if slave devices having identical terminal configurations are stacked in a stack device, the master device can control each slave device on the basis of the ID thereof.

Furthermore, it is possible to set IDs that allow each slave device to be identified, without varying the physical wiring configurations or connection states of the slave devices. Moreover, it is also unnecessary to vary the physical connection state or number of terminals provided on the slave devices according to the number of slave devices in the stack. Hereinafter a specific configuration is described.

Configuration

Figure 15:
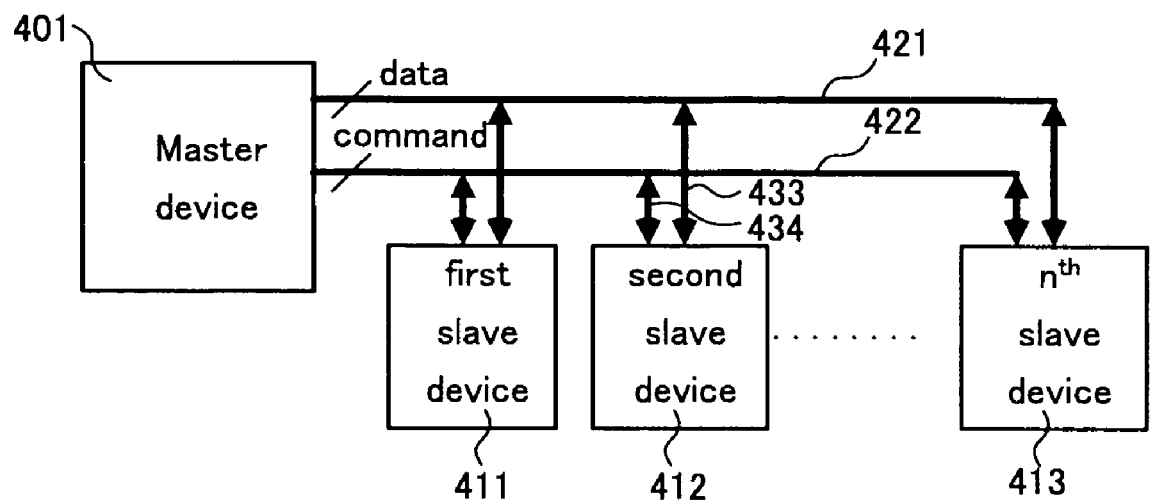
FIG. 15 is a block diagram of a system using a device identification method according to a third mode of embodiment of the present invention.

FIG. 15 is a structural view of a system for identifying devices using a device identification method according to a third embodiment of the present invention.

In FIG. 15, a master device 401 is connected to a first slave device 411, a second slave device 412 and so on up to an $n^{th}$ slave device 413 by command lines 422 and 434 and by data signal lines 421 and 433, respectively. In order to select the slave devices, the master device sends a command to the slave device in question via the command line.

The terminals of the master device and the slave devices have identical terminal arrangements as shown in FIG. 1A and FIG. 1B of the first embodiment; and the corresponding terminals are interconnected via the through-wires.

Functional Configuration

Figure 16A:
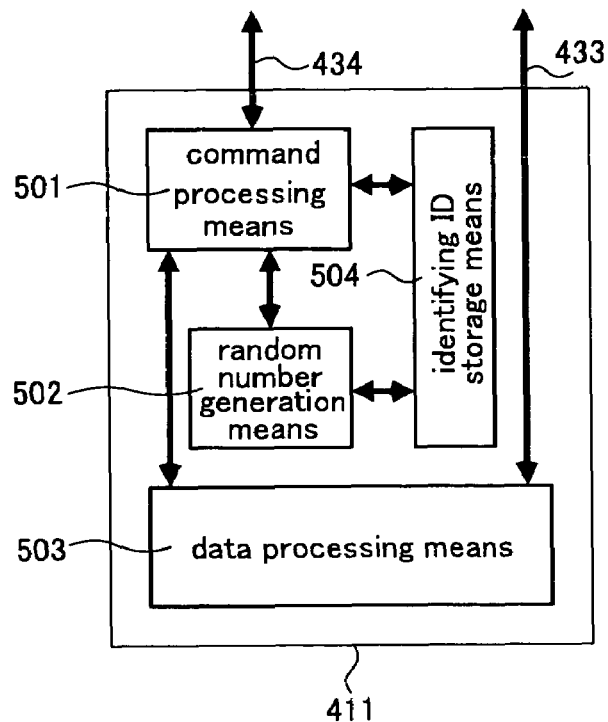
FIG. 16A is a block diagram of a slave device.
Figure 16B:
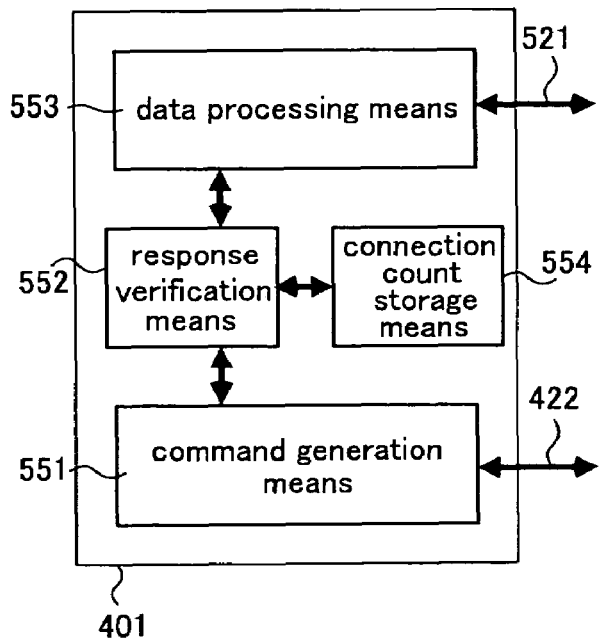
FIG. 16B is a block diagram of a master device.

FIG. 16A is a functional block diagram of a slave device in the third embodiment, and FIG. 16B is a functional block diagram of a master device. In FIGS. 16A and 16B, elements identical to those in FIG. 15 are identified by identical symbols and descriptions thereof are omitted.

In FIG. 16A, the slave device comprises: a command processing unit 501; a random number generation unit 502; a data processing unit 503; and an ID storage unit 504. The command processing unit 501 process commands transmitted from the master device 401 and control the transmission of responses to the master device 401. The commands comprise instructions to the slave device for generating a random number and range information related to the range in which the random number is to be generated. The random number generation unit 502 generate a random number within the range specified by the master device. The data processing unit 503 process data that is sent to and received from the master device, and process the sending of response signals. The ID storage unit 504 stores, as the ID for the slave device, a random number generated by the random number generation unit 502 in response to an instruction from the master device.

In FIG. 16B, the master device 401 comprises: a command generation unit 551; a data processing unit 553; a response verification unit 552; and a connection count storage unit 554. The command generation unit 551 generates commands for the slave device, such as requests for generation of a random number, which is no greater than the number of slave devices, and requests for return of a reply in accordance with the generated random number. The data processing unit 553 processes data that is sent to and received from the slave device and process response signals reception. The response verification unit 552 stores the number of responses transmitted from the slave devices. The connection count storage unit 554 stores the number of slave devices that are connected to the master device 401.

Processing (1) Overall Processing in the Master Device

Figure 17:
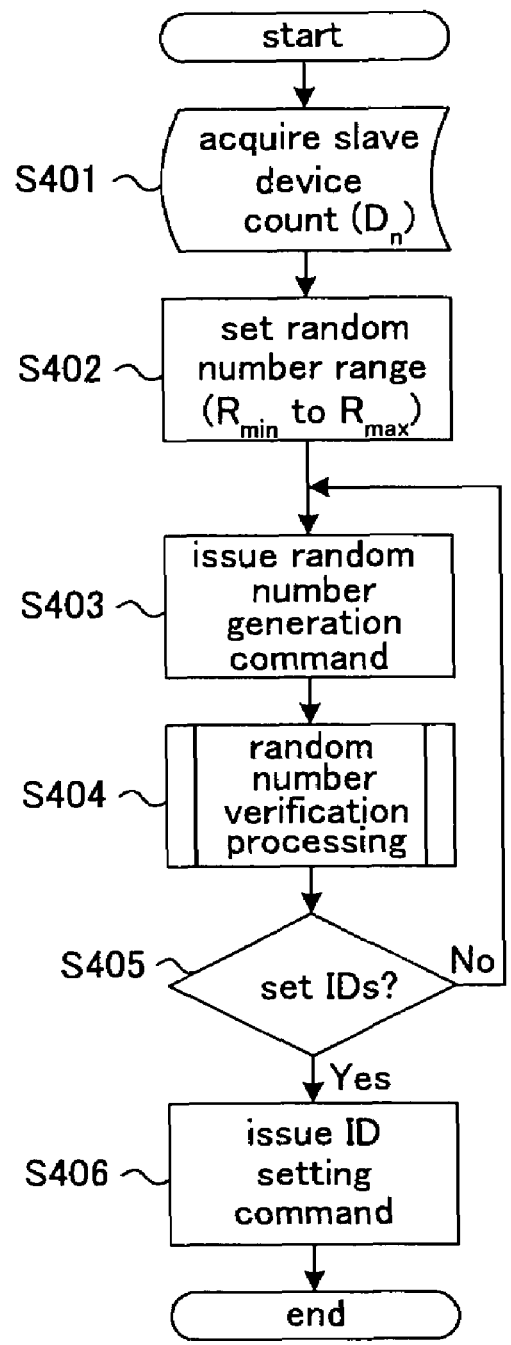
FIG. 17 is a flow chart illustrating an overview of the overall processing when the master device identifies the slave devices.

FIG. 17 is a flow chart illustrating an outline of the overall processing when the master device identifies the slave devices. With reference to FIG. 17, the overall processing when the master device identifies the slave devices will be described.

Step S401: The connection count storage unit 554 of the master device 401 acquires the number of slave devices. Here, the number of slave devices is noted as $D_n$. The number of slave devices $D_n$ may be pre-stored in the connection count storage unit 554 when the master device is manufactured, or maybe externally entered and stored in the master device after manufacturing.

Step S402: The command generation unit 551 of the master device 401 fixes the range for the random numbers generated by the slave devices. Here, the lower limit for the range of the random numbers generated is noted as $R_{min}$ and the upper limit is noted as $R_{max}$. Accordingly, the range in which random numbers are generated is $R_{min}$ to $R_{max}$. Here, the number arrived at by subtracting $R_{min}$ from $R_{max}$ is no less than the number of slave devices $D_n$. Note that the number arrived at by subtracting $R_{min}$ from $R_{max}$ may be greater than the number of slave devices $D_n$.

Step S403: The command generation unit 551 issues a random number generation command that is transmitted to the slave devices, so that the slave devices generate random numbers in the range fixed in step S402. This random number generation command includes range information indicating the range in which the random numbers are to be generated, and is conveyed to the slave devices via the command line 422.

Step S404: The data processing unit 553 and the response verification unit 552 of the master device 401 perform random number verification processing, so as to verify whether or not each of the slave devices has generated a unique random number.

Step S405: On the base of the results of step S404, the command generation unit 551 determines whether or not the slave devices can set the IDs that serve to identify the slave devices.

Step S406: If the IDs can be set, the command generation unit 551 issues an ID setting command. This ID setting command is conveyed to the slave devices via the command line 422 and 434.

(2) Random Number Verification Processing in the Master Device

Figure 18:
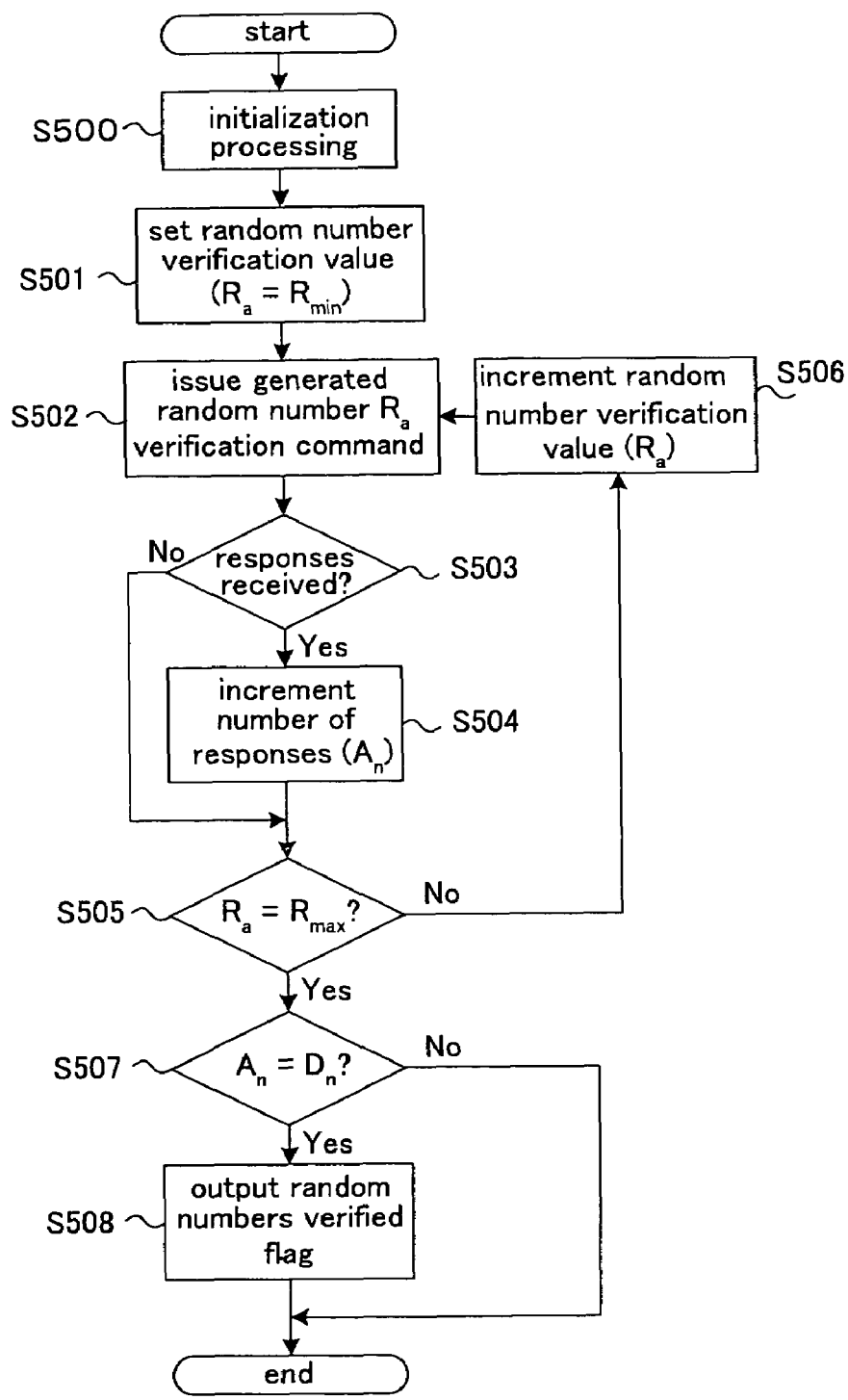
FIG. 18 is a flow chart showing the details of random number verification processing.

FIG. 18 is a flow chart showing the details of random number verification processing in step S404.

Step S500: At the beginning of random number verification processing, the response verification unit 552 perform processing that initializes registers, buffers and the like.

Step S501: In order to determine whether and not the slave devices have generated random numbers, the response verification unit 552 fix the value of a first random number. Here, the value fixed for the random number is noted as $R_a$. $R_a$ is fixed within the random number range fixed in step S402, and in this example $R_a$ is the minimum value $R_{min}$.

Step S502: The command generation unit 551 issue a generated random number verification command to the slave device by way of the data processing unit 553, so as to request a reply to the ID setting command. The generated random number verification command is a command that includes the $R_a$, and that requests that the slave device reply if the random number generated by the slave device and the $R_a$ are equal. Consequently, the response verification unit 552 of the master device receive a response from the slave device, by way of the data processing unit 553, if the random number generated by the slave device is equal to $R_a$.

Step S503: The response verification unit 552 verify whether or not there were responses from the slave devices.

Step S504: If a response was received in step S504, the response verification unit 552 store the number of responses received. Here, the number of responses from the slave device is noted as $A_n$, and for each response received, the number of responses $A_n$ is incremented by one. Note that $A_n$ is initialized to zero in step S500.

Step S505: Next, the response verification unit 552 determine whether or not $R_a$ has reached $R_{max}$.

Step S506: If the response verification unit 552 determine that $R_a$ has not yet reached $R_{max}$ in step S505, $R_a$ is incremented by one, thus changing the value of the random number to be verified with the slave device. Subsequently, step S502 is returned to, and the response verification unit 552 continue verification processing of the random number.

Step S507: If the response verification unit 552 determine that $R_a$ has reached $R_{max}$ in step S505, which is to say, when verification has been performed, for all of the values in the random number range determined in step S402, as to whether the slave devices have generated random numbers, a determination is then made as to whether or not the number of responses from the slave devices $A_n$ is equal to the number of slave devices $D_n$.

Consequently, it is possible to determine whether the slave devices have generated random numbers that differs from those of the other slave devices.

Step S508: If the response verification unit 552 verify that the number of responses $A_n$ is equal to the number of slave devices $D_n$ in step S507, a random number verified flag is output. In other words, the response verification unit 552 generate a random number verified flag if the slave devices each generate different random numbers. In the aforementioned step S405, if this random number verified flag is present, the command generation unit 551 determine that the slave devices can set IDs. Then, an ID setting command is transmitted to the slave devices.

(3) Overall Processing in the Slave Devices

Figure 19:
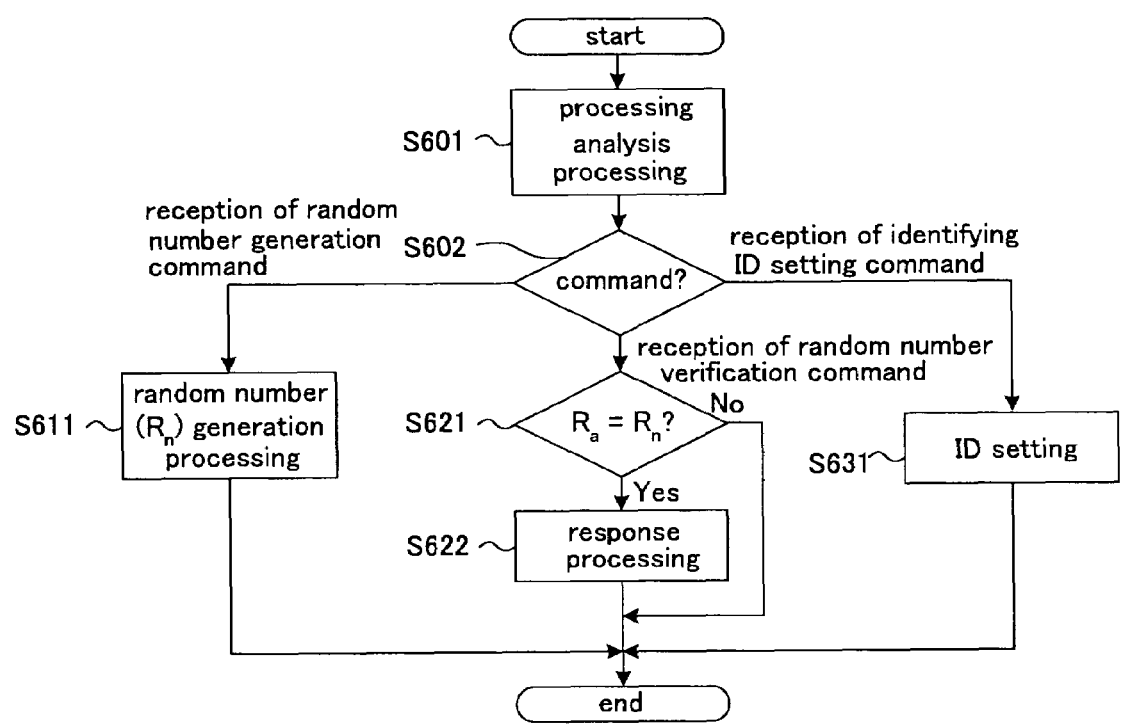
FIG. 19 is a flow chart showing an overview of the processing when the slave devices receive commands from the master device.

FIG. 19 is a flow chart showing an overview of the processing when the slave devices receive a command from the master device. With reference to FIG. 19, the processing in the slave devices will be described.

Step S601: The command processing unit 501 of the slave devices receive commands issued by the command generation unit 551 of the master device 401 via the command line 434. Furthermore, the command processing unit 501 determine the type of processing required by the received command. For example, a determination is made as to whether this is a random number generation verification command, a random number generation command, or an ID setting command.

Step S602: The command processing unit 501 determine whether to perform random number generation processing, random number verification processing, or ID setting processing in response to the type of command received.

Step S611: If the command is a random number generation command, the random number generation unit 502 generate a random number $R_n$ within the random number range set by the command generation unit 551 of the master device. Here, the generated random number is noted as $R_n$.

Step S621: If the command processing unit 501 receive a generated random number verification command including a random number $R_a$ for which verification is requested, that processing is performed. The command processing unit 501 receive the random number from the random number generation unit 502 and determine whether or not the random number generated by the slave device $R_n$ is equal to $R_a$.

Step S622: If the random number $R_a$ and the random number $R_n$ generated by the slave devices are equal, the command processing unit 501 return a response to the master device 401 by way of the data processing unit 503.

Step S631: If the ID setting command described above is received from the command generation unit 551 of the master device 401, the command processing unit 501 output the random number $R_n$ generated by the slave device to the ID storage unit 504, as the slave device specific ID.

Operative Effect

With the configuration described above, even if a plurality of slave devices are stacked in a stacked device, the master device can identify each slave device. For example, the master device selects the slave device to be controlled on the basis of the ID, and places that slave device in the selected state. Thereafter, this slave device can be controlled in various ways by sending commands thereto.

Furthermore, the stacked device can be manufactured by stacking the slave devices to which IDs have not yet been assigned, and then assigning the IDs when the stacked device is initialized, as described above. After initialization is complete, the master device accesses each of the slave devices on the basis of the IDs that have been set. Thus, even if the slave devices do not have IDs before being used to construct the stacked device, the IDs can be set after manufacturing the slave device. In other words, it is not necessary to assign an individual ID to each slave device when these are manufactured. Accordingly, if large numbers of slave devices are manufactured as chips on a wafer, these can easily be managed without the difficulty of managing each slave device according to the ID thereof. For example, there is no need for difficult operations such as selecting slave devices according to IDs from amongst a large number of slave devices that have been diced from a wafer. Accordingly, management of the slave devices after dicing is facilitated.

In particular, this is effective when the terminals of the master device and the slave devices have identical terminal arrangements, as shown in FIG. 1A and FIG. 1B in the first embodiment, and the corresponding terminals are interconnected by way of through-wires. That is to say, even if the slave devices are interconnected by terminals having identical terminal structures, via through-wires, the master device is able to access each slave device by way of the IDs that have been set. For example, the master device selects the slave device to be controlled on the basis of the ID, and places that slave device in the selected state. Thereafter, this slave device is controlled in various ways by sending commands thereto. Furthermore, because the through-wires interconnect corresponding terminals with identical terminal structures, the through-wires can be formed perpendicular to the slave device. Accordingly, complicated manufacturing processes such as forming the through-wires at an inclined angle with respect to the slave device are not necessary, so the stacked device can be manufactured easily.

Furthermore, because an ID is set in each slave device according to a random number from the slave device after stacking, it is not necessary to consider stacking order or stacking methods when stacking the slave devices. Accordingly, it is, for example, possible to stack the slave devices in a freely chosen manner, allowing the stacked device to be easily manufactured.

Furthermore, the terminals of the slave devices, to which the identification commands are input, are interconnected via the through-wires. In other words, there is no need for dedicated terminals for each slave device for the purpose of receiving the commands. Furthermore, because the identification command is changed as a result of passing through each slave device, there is no need to input slave device specific identification commands for each slave device.

Other

Note that, in the present embodiment, the ID storage unit 504 may be non-volatile memory, so that the ID is maintained even when the device is not electrified.

Furthermore, in the present embodiment, the IDs of the slave devices are determined according random numbers, but an individual slave device serial ID may be stored in the slave devices before assembling the slave devices.

Furthermore, in the present embodiment, the random number generation unit may generate a random number on the base of this serial ID.

Furthermore, in the present embodiment, the slave device may internally store device specification data, so that the master device can reference this specification data.

Fourth Embodiment

Configuration

Figure 20:
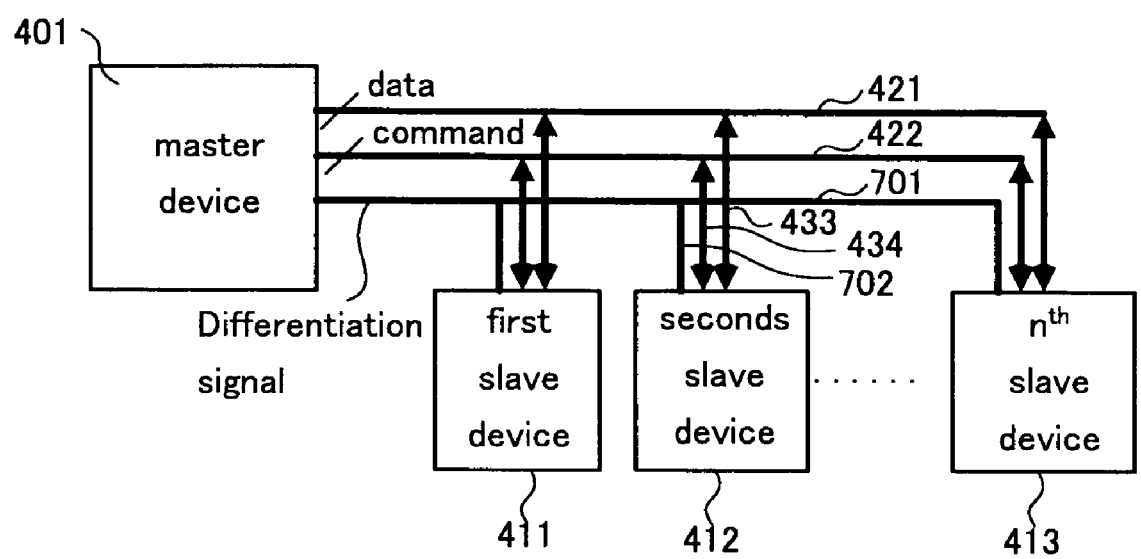
FIG. 20 is a block diagram of a system using a device connection count calculation device according to a fourth mode of embodiment.

FIG. 20 is a block diagram of a system for performing device identification using a master device according to a fourth embodiment of the present invention. In FIG. 20, differentiation signal lines 701 and 702 are analog signal lines for connecting the master device to the slave devices.

Furthermore, the terminals of the master device and the slave devices have identical terminal arrangements, as shown in FIG. 1A and FIG. 1B in the first embodiment, and the corresponding terminals are interconnected via the through-wires.

(1) Slave Device

Figure 21A:
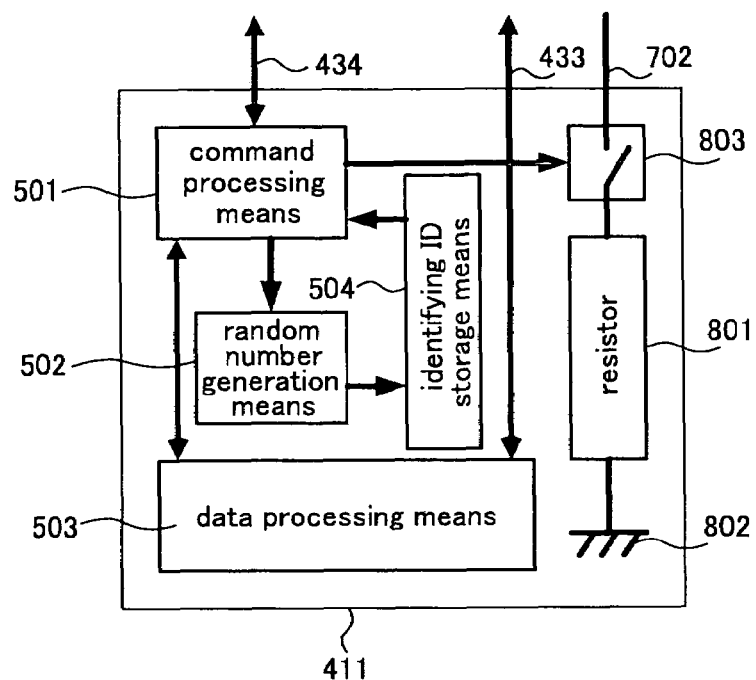
FIG. 21A is a block diagram of a slave device according to the fourth mode of embodiment.
Figure 21B:
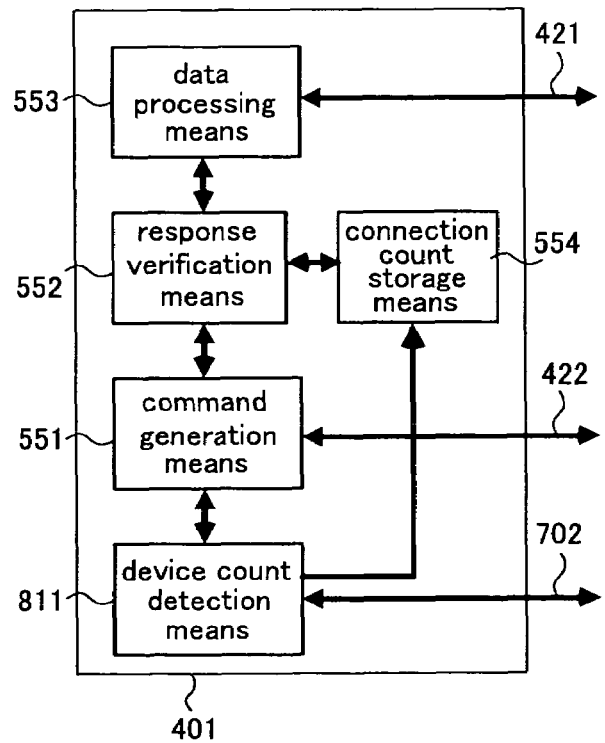
FIG. 21B is a block diagram of a master device according to the fourth mode of embodiment.

FIG. 21A is a block diagram of a slave device according to the fourth embodiment; and FIG. 21B is a block diagram of a master device. In a FIG. 21A and FIG. 21B, elements that are the same as in FIG. 16A and FIG. 16B are indicated using the same symbols, and descriptions thereof are omitted.

In FIG. 21A, the slave device comprises: command processing unit 501; random number generation unit 502; data processing unit 503; ID storage unit 504; a resistor 801 and switch unit 803. The differentiation signal line 702 is connected to the resistor 801, which has a constant value, by way of the switch unit 803. The other end of the resistor 801 is connected to ground 802. Here, the switch unit 803 are switches that are opened and closed under the control of the command processing unit 501.

(2) Master Device

In FIG. 21B, the master device 401 comprises: command generation unit 551; data processing unit 553; response verification unit 552; connection count storage unit 554; and device count detection unit 811. The device count detection unit 811 detect the number of slave devices based on the potential of the differentiation signal line 702.

(3) Device Count Detection Unit

Figure 22:
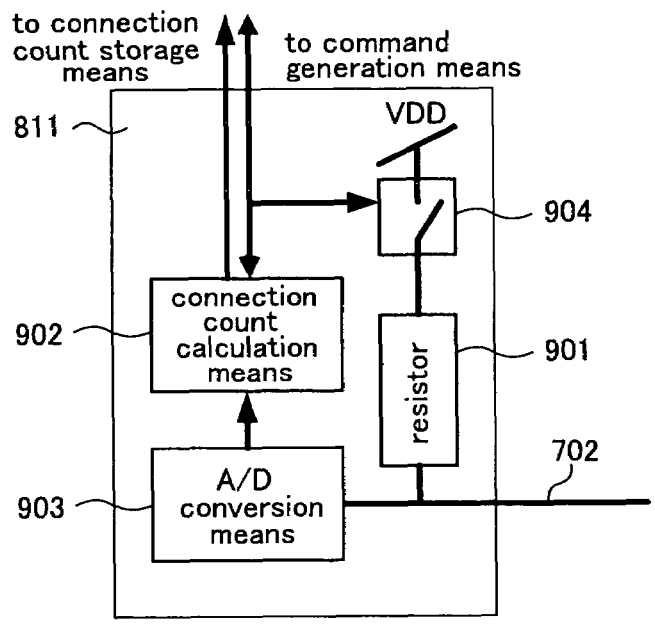
FIG. 22 is a block diagram of a device count detection unit according to the fourth mode of embodiment.

FIG. 22 is a block diagram of one example of device count detection unit 811 according to the fourth embodiment. In FIG. 22, the differentiation signal line 702 is connected to, for example, a source $V_{DD}$, having a fixed voltage, by way of switch unit 904, and a resistor 901 having a fixed resistance. These switch unit 904 are opened and closed under the control of commands from the command generation unit 551. Furthermore, the differentiation signal line 702 is connected to A/D conversion unit 903. Here, the A/D conversion unit 903 receive the potential of the differentiation signal on the differentiation signal line, convert this to a digital value, and output it to the connection count calculation unit 902. The connection count calculation unit 902 determine the number of slave devices that are connected to the master device from the potential information in the differentiation signal input thereto.

Figure 23:
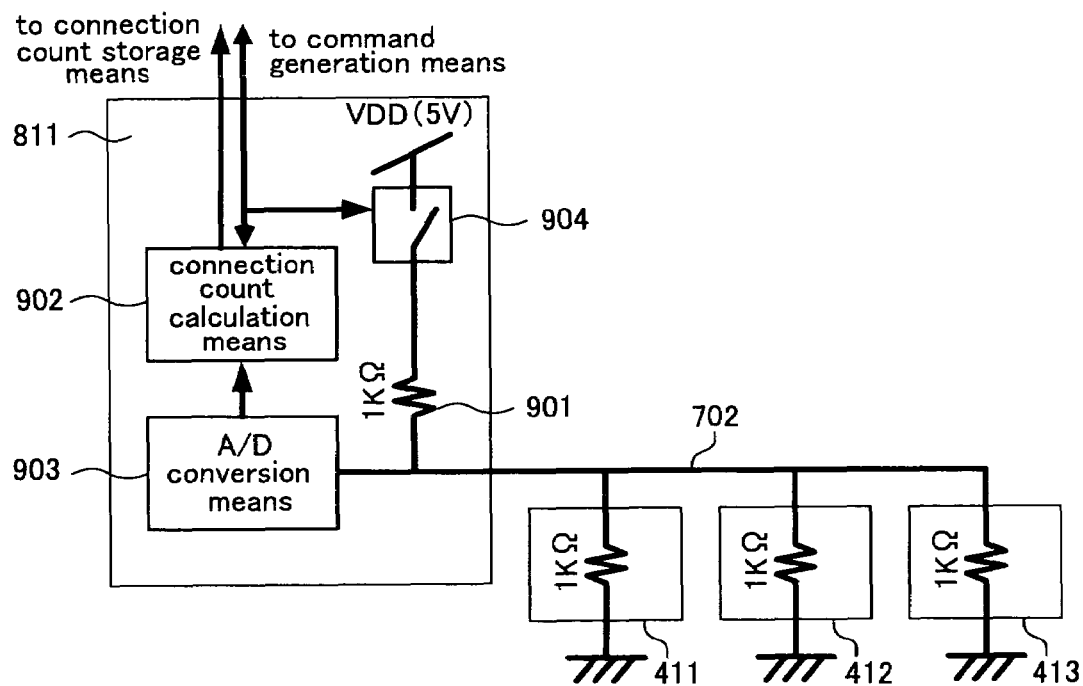
FIG. 23 is a specific example of a device count detection unit.

In FIG. 23, a specific example of device count detection unit is shown. In FIG. 23, elements that are the same as in FIG. 22 are indicated by the same symbols, and descriptions thereof are omitted.

In FIG. 23, a resistor 901 of the device count detection unit 811 is a 1 kΩ resistor and $V_{DD}$ is 5 V. The slave devices connected to the master device are the first through third slave devices 411, 412 and 413, so the slave device count is "3". Furthermore, in each slave device, the differentiation signal line 702 is connected to ground by way of a 1 kΩ resistor.

If these switch unit 904 are closed by way of a command from the command generation unit 551, the differentiation signal line 702 is connected to $V_{DD}$ (5 V) by way of the resistor 901. Because three 1 kΩ resistors are connected in parallel between the differentiation line 702 and ground, the impedance between the differentiation signal lines 702 and ground is approximately 333 Ω. Accordingly, due to voltage division with the resistor 901, the potential of the differentiation signal line 702 is approximately 1.25 V. The A/D conversion unit 903 detect the potential of the differentiation signal line 702, convert this to digital data, and output this to the connection count calculation unit 902.

Figures 24, 25:
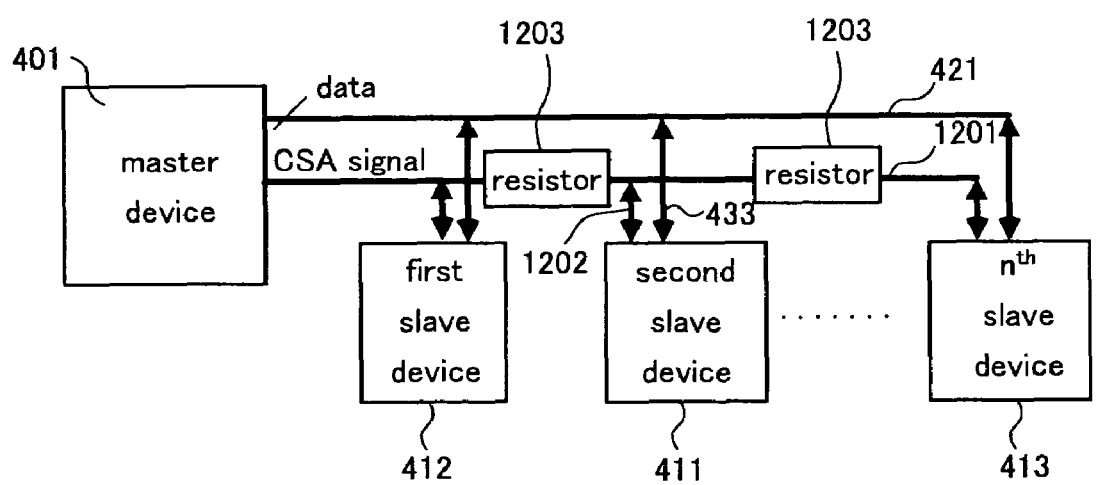
FIG. 24 is a device count detection table for calculating the number of devices from the differentiation signal potential.
FIG. 25 is a block diagram of a system using a device identification method according to the third mode of embodiment of the present invention.

The connection count calculation unit 902 comprises a device count detection table for the purpose of calculating the number of devices from the differentiation signal potential, for example as shown in FIG. 24. Accordingly, the connection count calculation unit 902 calculates the number of slave devices that are connected on the basis of the potential of the differentiation signal that is input, by referencing the device count detection table. The device count detection table in FIG. 24 is used for calculations based on the value of the resistor 901 in the master device 401 and the value of the resistors connected to the differentiation signal lines 702 in the slave devices. Here, because the potential of the differentiation signal is 1.25 V, the connection count calculation unit 902 calculates that the number of slave devices is "3". The connection count storage unit 554 stores the calculated slave device count.

As indicated in the third embodiment described above, the response verification unit 552 receives a response from slave devices that have generated a random number that is equal to the numerical value which is to be verified $R_a$. At this time, if the numerical value to be verified $R_a$ and the random number generated by the slave device $R_n$ are the same, the command generation unit 551 generate a command so as to close the switch unit 803 only in the slave device that generated this random number. The command generation unit 551 send that command to the slave device in question. Consequently, the device count detection unit 811 are able to obtain the number of slave devices having generated random numbers $R_n$ equal to the numerical value $R_a$. Here, if the number of slave devices acquired by the device count detection unit 811 is 1, the command generation unit 551 generate an ID setting command for the slave device having generated the random number $R_n$ that is equal to the numerical value $R_a$, so that it outputs the generated random number to the ID storage unit 504. Consequently, the slave device having received the ID setting command sets the ID for the slave device, based on the generated random number.

Likewise, for all of the numerical values in the generated random number range, the device count detection unit 811 verify the number of slave devices having generated random numbers equal to the numerical value. If the number of slave devices having generated random numbers equal to the numerical value is 1, the command generation unit 551 generates the ID setting command. Consequently, the slave device having received the ID setting command, sets the ID for the slave device based on the generated random number.

Here, the command generation unit 551 can fix a random number range that excludes the numerical values of verified IDs, and transmit this to the slave devices for which the IDs have not been verified. Then, the processing described above is performed for the random number range that has been fixed. That is to say, the device count detection unit 811 check the number of slave devices that have generated random numbers $R_n$ equal to the numerical value $R_a$ to be verified, within the generated random number range. Then, for slave devices wherein the number of slave devices having generated a random number $R_n$ equal to the numerical value $R_a$ to be verified is 1, the random number generated by that slave device is output to the ID storage unit 504 and the ID is stored.

As described above, if the number of slave devices having generated a random number equal to the numerical value to be verified is 1, the ID is confirmed, and only in the case where this is more than 1, is the random number generated once again, this being repeated until IDs have been confirmed for all of the slave devices.

Operative Effect

As described above, the master device comprises device count detection unit 811 for detecting the number of slave devices, based on the potential of the differentiation signal line 702. At this time, the potential of the differentiation signal line changes depending on the number of slave devices connected to the differentiation signal line 702. Accordingly, by determining the potential thereof, it is possible to detect the number of slave devices connected to the master device.

Furthermore, in the response verification, the master device checks the number of slave devices having generated random numbers $R_n$ equal to the numerical value $R_a$ to be verified. Then, the ID is confirmed for slave devices wherein the number of slave devices having generated a random number $R_n$ equal to the numerical value $R_a$ to be verified is 1. Consequently, it is possible to reduce the probability of duplicating random numbers when fixing IDs.

Otherwise, the same operative effect as in the third embodiment can be achieved.

Other

In the foregoing, the connection count calculation unit 902 comprise a device count detection table. However, the number of slave devices ($D_n$) may be calculated based on information regarding: the value (given as $R_h$) of the resistor 901 in the master device 401, which is connected to the differentiation signal lines 702; the value (given as $R_d$) of the slave device resistor; and the potential (given as $V_h$) connected to the resistor 901, for example based on the differentiation signal potential (given as the $V_r$) by the following formula.

$$Dn \approx Rd(Vh-Vr) \div (Rh \times Vr) \quad (1)$$

Fifth Embodiment

Configuration

FIG. 25 is a block diagram of a system for identifying devices using a device identification method according to a fifth embodiment of the present invention. In FIG. 25, elements that are the same as in FIG. 15 are indicated by the same symbols, and descriptions thereof are omitted.

In FIG. 25, analog chip select signal wires (hereinafter referred to as CSA signal wires) 1201 and 1202 are analog signal lines connecting the master device 401 to the slave devices. Furthermore, a resistor 1203 is a resistor for interconnecting the slave devices, this being a resistor having a fixed value, which is inserted in series on the CSA signal wire.

The terminals of the master device and the slave devices have identical terminal arrangements as shown in FIG. 1A and FIG. 1B in the first embodiment, and the corresponding terminals are interconnected via the through-wires. An example wherein the resistor 1203 is used in a three dimensionally mounted semiconductor device of this sort is described hereinafter.

(1) Resistor

Figure 26A:
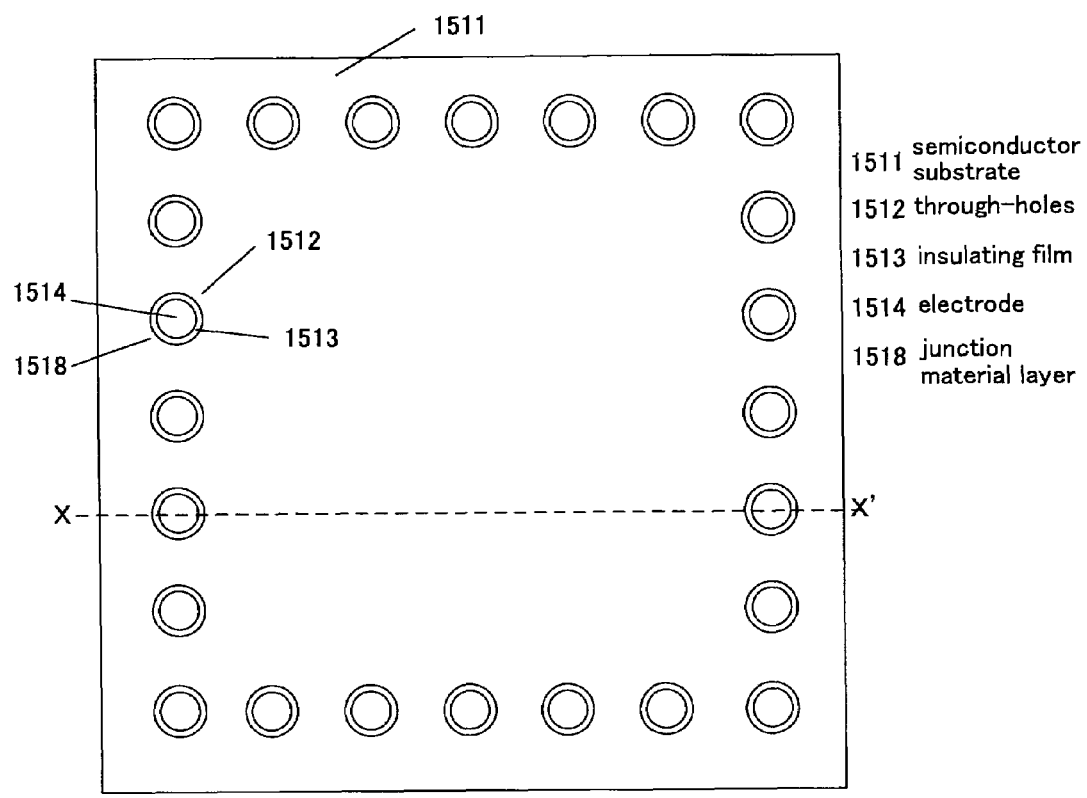
FIG. 26A is a view illustrating a slave device in a fifth mode of embodiment of the present invention.
Figure 26B:
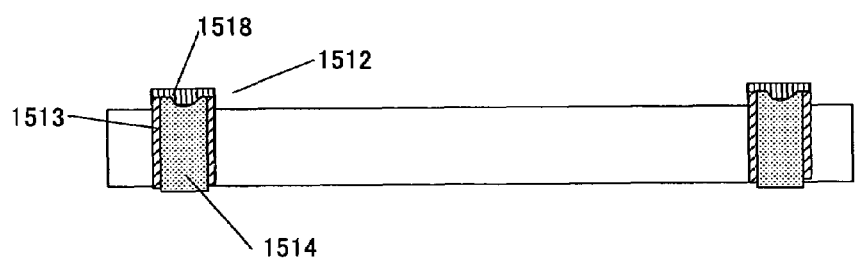
FIG. 26B is a sectional view illustrating a slave device in a fifth mode of embodiment of the present invention.

FIGS. 26A and B serve to describe a slave device according to an embodiment of the present invention; FIG. 26A is a plain view of a chip, and FIG. 26B is a sectional view according to the line X-X in FIG. 26A.

In FIGS. 26A and B, through-holes 1512 are formed along the four sides of a semiconductor substrate (for example a semiconductor memory chip) 1511. Within these through-holes 1512, insulating film 1513, of silicon oxide or the like, is formed on the surface of the semiconductor substrate 1511. Furthermore, electrodes 1514 made from a conductive material are provided so as to be insulated from the semiconductor substrate 1511, because the insulating film 1513 is interposed therebetween in the through-hole 1512. Then, a junction material layer 1518 is formed on the principal face of the substrate 1511 on the electrodes 1514. Note that, in terms of the material for the electrodes 1514, in addition to the copper and tungsten described above, alloys containing these metals, as well as Al, MO, polysilicon, Au, alloys containing these metals, and the like can be used. Furthermore, in terms of the junction material layer 1518, Au, Pb/Sn, Sn, Au/Sn, Sn/In, Sn/Bi, and the like can be used.

Figure 27A:
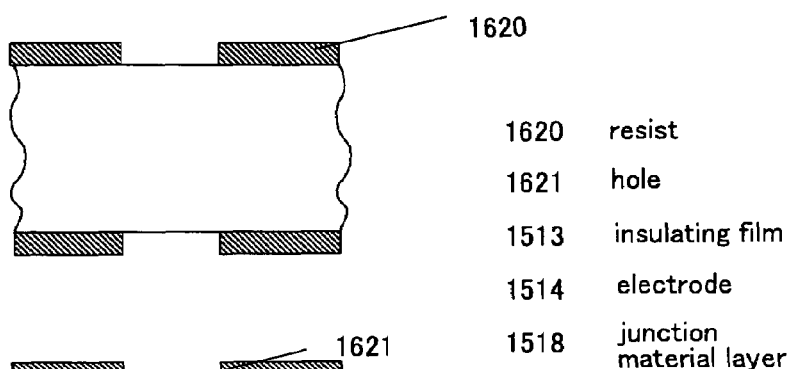
FIG. 27A is a view illustrating a first step in manufacturing a slave device in the fifth mode of embodiment of the present invention.

Next, a method of manufacturing the semiconductor device above, will be described. FIGS. 27A and C show enlargements of the manufacturing process for the electrode 1514 and the surrounding area in the semiconductor device.

First, as shown in FIG. 27A, a resist 1620 is formed on the principle face of the semiconductor substrate 1511, and a pattern is formed by a photolithography.

Figure 27B:
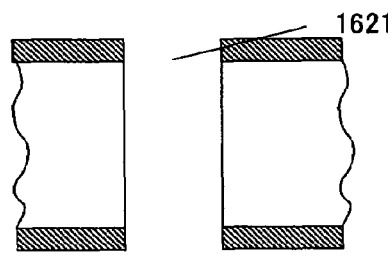
FIG. 27B is a view illustrating a second step in manufacturing a slave device in the fifth mode of embodiment of the present invention.

A hole 1621 is formed by chemical etching, as shown in FIG. 27B. This can also be formed by laser machining or high-density plasma etching.

Figure 27C:
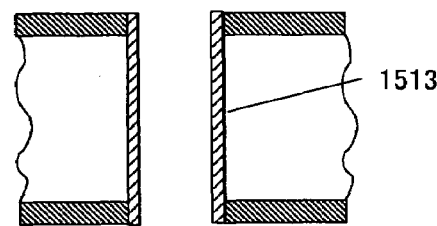
FIG. 27C is a view illustrating a third step in manufacturing a slave device in the fifth mode of embodiment of the present invention.

The insulating film 1513 is formed from silicon oxide or the like, by thermal oxidization or CVD, on the inner wall of the hole 1621, as shown in FIG. 27C.

Figure 27D:
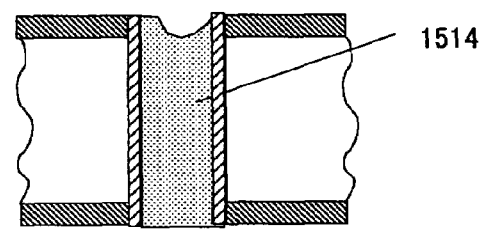
FIG. 27D is a view illustrating a fourth step in manufacturing a slave device in the fifth mode of embodiment of the present invention.

Next, as shown in FIG. 27D, the interior of the hole 1621 is filled with an electrode 1514, by way of screen printing of an electroconductive paste. At this time, in order that the hole 1621 be fully filled with the electroconductive paste, it is preferable that the printing be performed more than twice. Furthermore in order to reduce voids in the electroconductive paste when printing two more times, it is preferable that this be performed in a reduced pressure chamber or the like. Furthermore, it is preferable that an electroconductive paste be used for the material of the electrode 1514.

If the vias (which is to say the through-holes 1512 in FIG. 26) that are formed for the CS terminals of the stacked device (for example, memory) have a length of 100 μm, a hole diameter of 10 μm, and are to have a resistance of 10 Ω, the resistivity of the electroconductive paste will be approximately $1.0 \times 10^{-5}$ Ω·m. Common metal materials are approximately $2.0 \times 10^{-8}$ to $1.0 \times 10^{-6}$ Ω·m, making it difficult to generate the desired potential difference. The electroconductive paste comprises an electroconductive filler and a resin. In terms of the electroconductive filler material, powders of Au, Ag, Cu, Ni, Pd or Al, or particles of alloys thereof, can be used, and these can, for example, be mixed with thermosetting resins. Copper is particularly effective because it has good electroconductivity, little migration, and is inexpensive. Furthermore, if silver coated copper powder, wherein the copper particles have been coated with silver, is used, it is possible to prevent increases in the resistance of the copper due to oxidization. If silver coated copper powder is used, it is preferable that the amount of electroconductive filler combine therewith be 60 to 80 wt %, and 65 to 75 wt % is particularly preferable. If the amount of electroconductive filler exceeds 80 wt %, the resistivity of the electroconductive paste drops below approximately $1.0 \times 10^{-6}$ Ω·m. Furthermore, if this is less than 60 wt %, the resistivity increases to greater than approximately $10 \times 10^{-4}$ Ω·m. For the thermosetting resin, liquid epoxy resin is stable in terms of heat resistance. If a thermosetting resin is used, after filling the hole 21 with the electroconductive paste, the desired resistance can be achieved by hardening for approximately 30 minutes at 200° C.

Figure 27E:
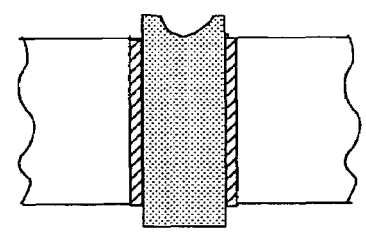
FIG. 27E is a view illustrating a fifth step in manufacturing a slave device in the fifth mode of embodiment of the present invention.

Next, as shown in FIG. 27E the resist 1620 is removed from the substrate 1511. By removing the resist 1620, it is possible to remove all foreign objects and the like that have adhered to the surface of the resist 1620 during processes such as screen printing.

Figure 27F:
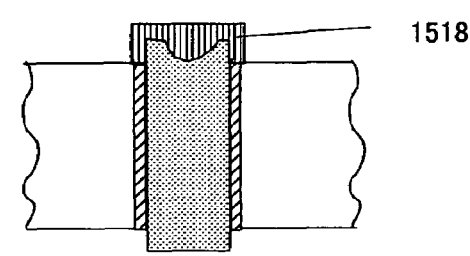
FIG. 27F is a view illustrating a sixth step in manufacturing a slave device in the fifth mode of embodiment of the present invention.

Subsequently, as shown in FIG. 27F a junction material layer 1518 is formed on the electrodes 1514 on the principle face of the substrate 1511.

Consequently, the predetermined resistance can be given to the through-holes 1512 shown in FIG. 26A.

(2) Slave Device

Figure 28A:
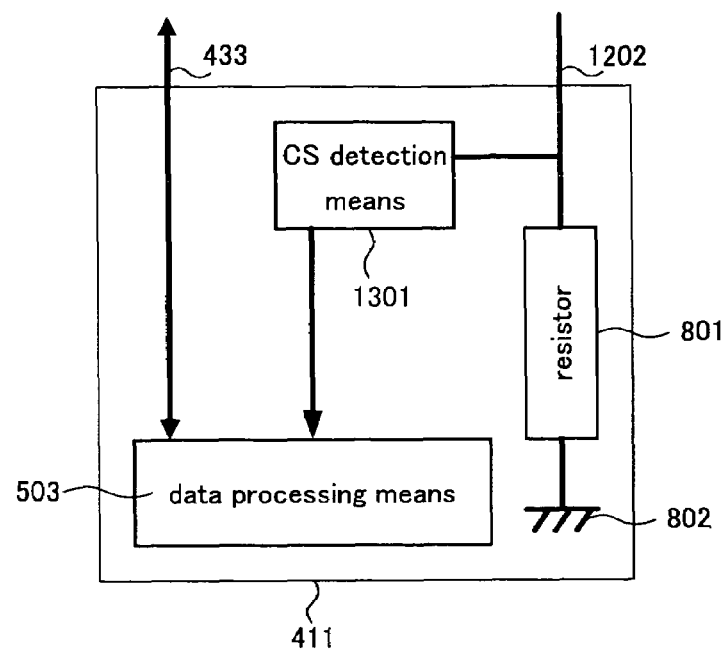
FIG. 28A is a block diagram of a master device according to the fifth mode of embodiment of the present invention.
Figure 28B:
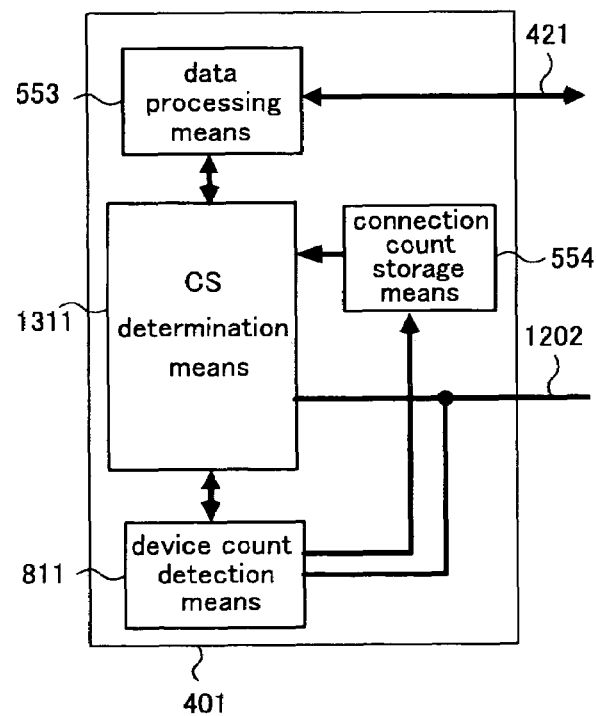
FIG. 28B is a block diagram of a slave device according to the fifth mode of embodiment of the present invention.

FIG. 28A is a block diagram of a slave device in the fifth embodiment; and FIG. 28B is a block diagram of a master device. In a FIG. 28A and FIG. 28B, elements that are the same as in FIG. 16A and FIG. 16B are indicated using the same symbols, and descriptions thereof are omitted.

In FIG. 28A, a slave device comprises CS detection unit 1301, a resistor 801, and data processing unit 503. The CS detection unit 1301 detect the potential of a CSA signal wire 1202. Next, if the potential of the CSA signal wire 1202 is a predetermined potential, the CS detection unit 1301 permit data processing unit 503 to send and receive data by the data signal line 121.

(2) Master Device

In FIG. 28B, a master device 401 comprises data processing unit 553, CS determination unit 1311, connection count storage unit 554, and device count detection unit 811. Determination unit 1311 apply a different potential to the CSA signal wire 1202, according to the desired slave device to be accessed.

(3) CS Determination Unit

Figure 29:
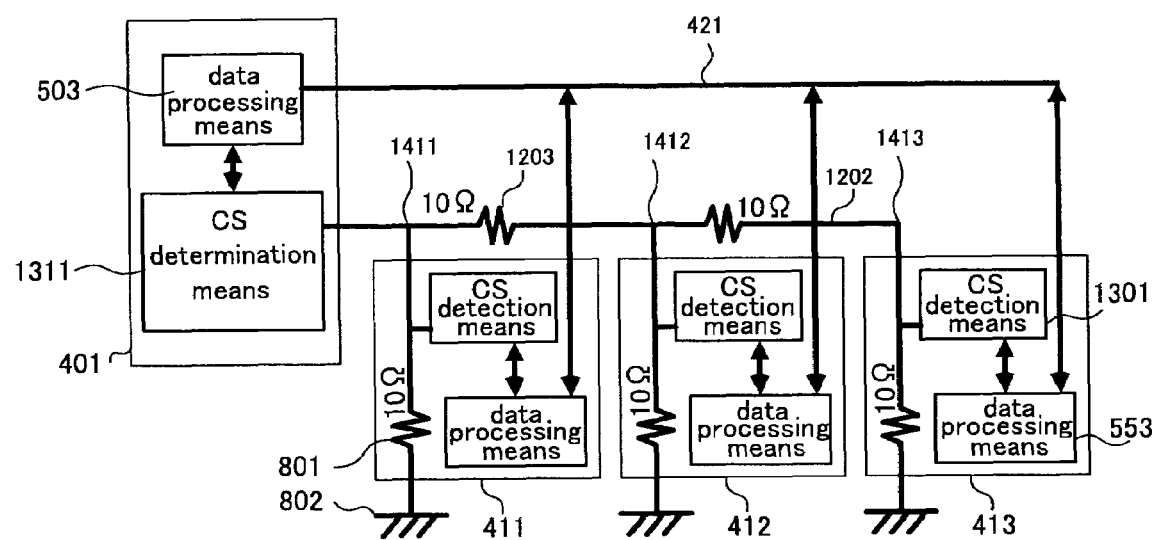
FIG. 29 is a diagram describing a specific example of a device identification method in the third mode of embodiment of the present invention.

FIG. 29 shows a specific example of chip select by the CS determination unit 1311 in the fifth embodiment. In FIG. 29, elements that are the same as those in FIG. 28A, FIG. 28B and FIG. 25 are indicated by the same symbols, and descriptions thereof are omitted.

In FIG. 29, resistors 801 that are connected to the CSA signal line in the slave devices 411, 412 and 413 are 10 Ω resistors. Furthermore, the resisters 1203, between the slave devices, are 10 Ω resistors. Note that, in this case, three slave devices are connected to the master device 401. The CS detection unit 1301 allow the data processing unit 553 to send and receive data with the master device 401, by way of the data signal line 421, when the potential of the CSA signal line 1202 is 0.5V±0.1V.

If the first slave device 411 is to be accessed, the CS determination unit 1311 of the master device apply 0.5 V to the CSA signal line 1202. Consequently, the potential at a point 1411, which is detected by the CS detection unit of the first slave device 411 becomes 0.5V±0.1 V. At this time, the CS detection unit of the second slave device 412 detect a potential of 0.2 V at the point 1412. Note that the potential at the point 1412 is divided by the resisters 801 and 1203. Furthermore, the CS detection unit of the third slave device 413 detect a potential of 0.1 V at the point 1413. Likewise, the potential at the point 1413 is divided by the resistor 801 and the two resisters 1203. Accordingly, the CS detection unit 1301 do not allow data to be sent and received by the second and third slave devices.

Next, when the second slave device 412 is to be accessed, the potential at the point 1412 must be 0.5V±0.1V. Accordingly, the CS determination unit 1311 of the master device apply 1.25 V to the CSA signal line 1202. At this time, on the CSA signal line, the potential at the point 1411 is 1.25 V, the potential at the point 1412 is 0.5 V and the potential at point 1413 is 0.25 V. Accordingly, the CS detection unit 1301 only allow the second slave device 412 to send and receive data with the master device 401.

Likewise, if the third slave device 1403 is to be accessed, the CS determination unit 1311 apply 5 V to the CSA signal line 1202.

Operative Effect

With such a configuration, the master device applies a potential according to the slave device to be accessed. Consequently, the CS detection unit of the slave device detect the potential that has been divided by the resistors inserted between the slave devices, and can determine whether data is to be sent and received with the master device.

Otherwise, the same operative effect as in the third embodiment can be achieved.

Sixth Embodiment

Configuration

Figure 30:
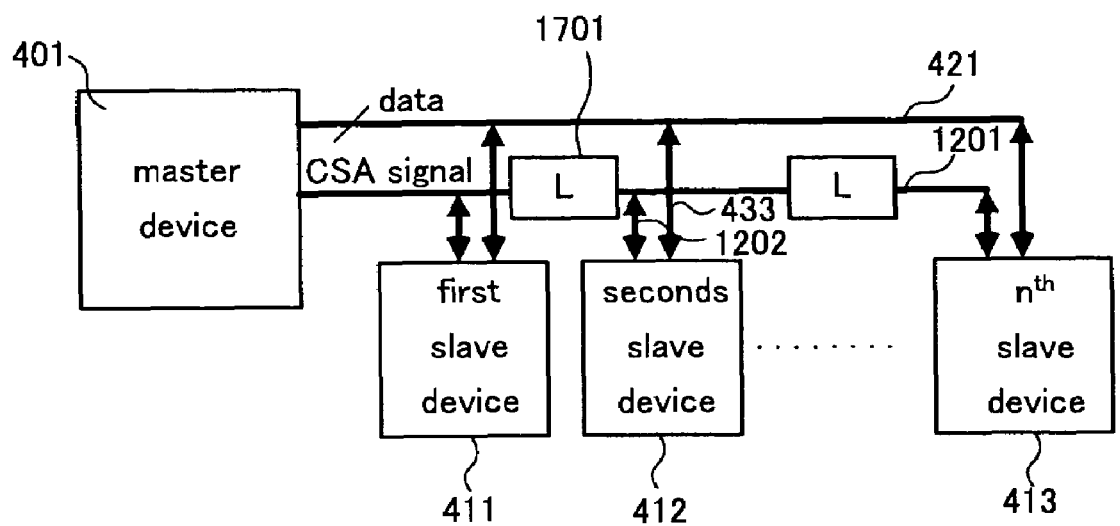
FIG. 30 is a block diagram of a system using a device identification method according to a fourth mode of embodiment of the present invention.

FIG. 30 is a block diagram of a system for identifying devices using a device identification method according to a sixth embodiment of the present invention. In FIG. 30, elements that are the same as in FIG. 15 are indicated by the same symbols, and descriptions thereof are omitted.

In FIG. 30, un inductor 1701 is connected between the slave devices, this being an inductor having any fixed value that is inserted in series on the CSA signal line.

The terminals of the master device and the slave devices have identical terminal arrangements as shown in FIG. 1A and FIG. 1B of the first embodiment, and the corresponding terminals are interconnected via the through-wires.

(1) Slave Device

Figure 31A:
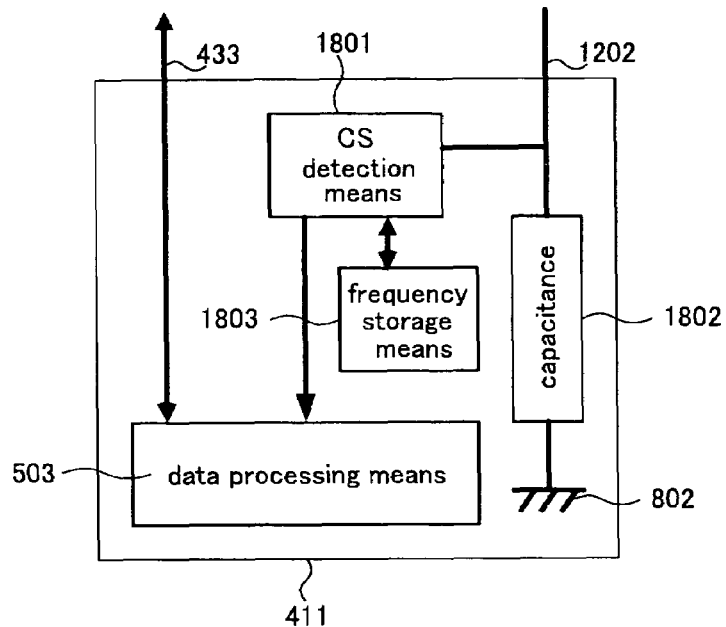
FIG. 31A is a block diagram of a master device according to the fourth mode of embodiment of the present invention.
Figure 31B:
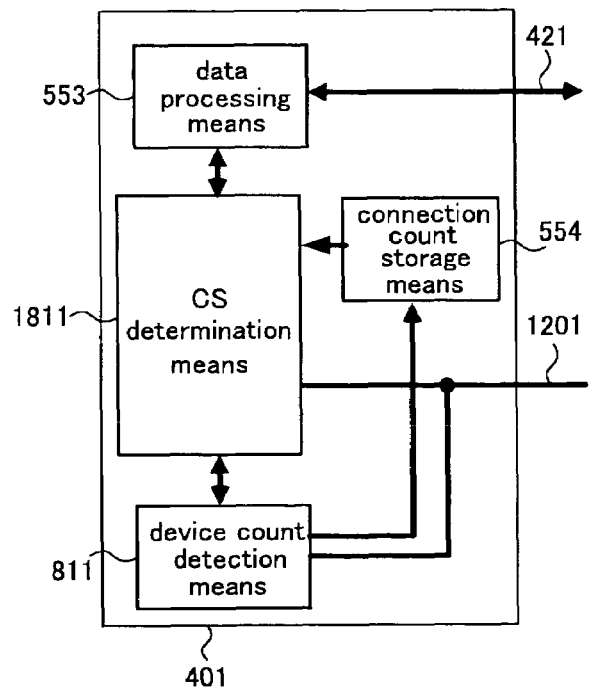
FIG. 31B is a block diagram of a slave device according to the fourth mode of embodiment of the present invention.
Figure 32:
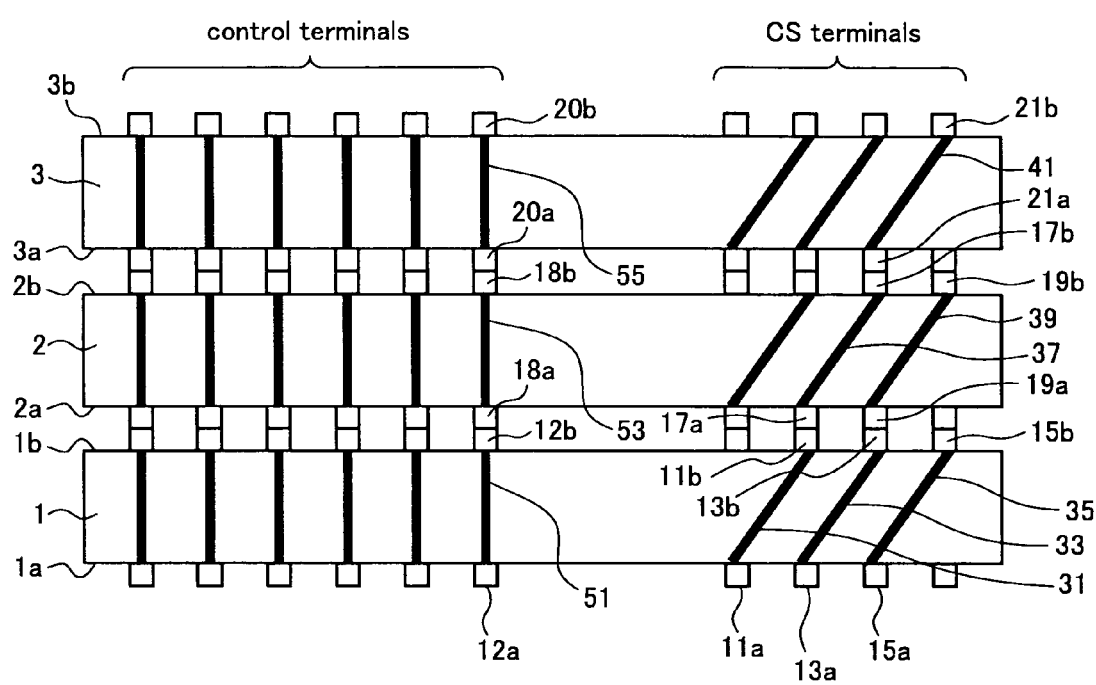
FIG. 32 is a structural diagram of a three-dimensional stacked semiconductor device in the prior art.

FIG. 31A is a block diagram of a slave device in the sixth embodiment; and FIG. 31B is a block diagram of a master device. In FIG. 31A and FIG. 31B, elements that are the same as in FIG. 16A and FIG. 16B are indicated using the same symbols, and descriptions thereof are omitted.

In FIG. 31A, the slave device comprises CS detection unit 1801, frequency storage unit 1803, capacitance 1802 and data processing unit 503. The CS detection unit 1801 are connected to the CSA signal wire 1202 and the capacitance 1802. Furthermore, the capacitance 1802 is connected between ground and the CSA signal wire 1202. Here, a low pass filter is formed between the inductor 1701 and the capacitance 1802. The CS detection unit 1801 detect signal frequencies from the signals nming through the CSA signal line 1202, of greater than a specific power that have passed through this low pass filter. Then, if the frequency detected by the CS detection unit 1801 is lower than the frequency stored in the frequency storage unit 1803, the data processing unit 503 allow data to be sent and received by way of the data signal line 121.

Furthermore, if a frequency is not stored in the frequency storage unit 1803, the CS detection unit 1801 store the first signal frequency detected that is above the fixed power in the frequency storage unit 1803.

(2) Master Device

The master device 401 comprises: data processing unit 553; CS determination unit 1811; connection count storage unit 554; and device count detection unit 811. In FIG. 31B, the CS determination unit 1811 apply signals having different fixed frequencies to the CSA signal wire 1201, according to the desired slave device to be accessed.

Processing and Operative Effect

The CS detection unit of the master device apply a frequency to the analog chip select signal line that is connected to the slave device according to the slave device to be accessed. As described above, a low pass filter structure is formed by way of the inductor inserted between the slave devices and the capacitance connected to the analog chip select signal of the slave device. Accordingly, the CS detection unit can detect fixed frequencies of greater than a fixed power and determine whether or not data can be sent and received with the master device.

Note that storage of the frequency in the frequency storage unit 1803 may, for example, be performed by way of a command that is transmitted on a command line. Otherwise, the same operative effect as in the third embodiment can be achieved.

Other Modes of Embodiment

Execution of the methods described above by a computer, computer programs, or computer readable media storing these computer programs is within the scope of the present invention. Here, examples of computer readable storage media include flexible disks, hard disks, CD-ROM, MO, DVD, DVD-ROM, DVD-RAM, BD (Blue-ray Disc) semiconductor memory, and the like.

The aforementioned computer programs are not limited to those stored on the storage media, but may be transmitted by way of such as electronic communication lines, wireless or wired communication lines, and networks, of which the Internet is representative.

The device identification method and the devices according to the present invention can be applied to mobile devices requiring high-density mounting by way of three-dimensional mounting, memory modules requiring a multiplicity of connections between a plurality of semiconductor devices, and the like.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A stacked device comprising a stack of a master device and a plurality of slave devices, having identical terminal arrangements,
said master device comprising:
a command transmission unit configured to input an identification command to a terminal of an adjacent slave device;
an ID (identifier) reception unit configured to receive, from the slave devices, slave device IDs that have been set in response to said identification command; and
a correspondence storage unit configured to store correspondences between the slave devices and the IDs;
each slave device comprising:
a through-wire for interconnecting at least one terminal of the slave device and an adjacent slave device; and
a command reception unit configured to receive said identification command; and
an ID setting unit configured to set the ID of the slave device based on said identification command;
wherein the positions of the terminals that are interconnected with said adjacent slave device differing in each slave device, so that, in each slave device, said slave device command reception unit receives an identification command having a modified value as a result of transiting through-wires that are connected at differing positions in each slave device.

2. The stacked device recited in claim 1, wherein, in said slave devices:
before said identification command is input, the terminal to which said identification command is input is clamped at a predetermined potential first potential; and
the identification command that is received by said command reception unit is generated by changing the potential of said terminal from said first potential as a result of inputting the identification command via said through-wire.

3. A stacked device comprising a stack of a master device and a plurality of slave devices, having identical terminal arrangements, said master device comprising:
a first command transmission unit configured to input an identification command to a terminal of an adjacent slave device;
an ID reception unit configured to receive, from the slave devices, slave device IDs that have been set in response to said identification command; and
a correspondence storage unit configured to store correspondences between the slave devices and the IDs;
each slave device comprising:
a through-wire for interconnecting at least one terminal of the slave device and an adjacent slave device;
a command reception unit configured to receive said identification command from said master device or an adjacent slave device;
an ID setting unit configured to set an ID for the slave device, as a result of receiving said identification command;
a command modification unit configured to modify the received identification command to a slave device specific identification command; and
second command transmission unit configured to input the modified identification command to an adjacent slave device via said through-wire.

4. The stacked device recited in claim 3, further comprising a completion notification transmission unit configured to transmit a completion notification indicating that setting of said ID has been completed, to said master device, via said through-wire, when said ID setting unit have set said ID.

5. A master device for a stacked device comprising a stack of a master device and a plurality of slave devices, having identical terminal arrangements, comprising:
a command transmission unit configured to input a random number generation command for starting random number generation to a terminal of an adjacent slave device;
a determination unit configured to receive random numbers generated by the slave devices and determining whether or not the values of the random numbers are different from each other;
an ID reception unit configured to receive, from each slave device, the IDs of the slave devices that have been set in response to said random number generation command; and
a correspondence storage unit configured to store correspondences between the slave devices and the IDs.

6. A slave device for a stacked device comprising a stack of a master device and a plurality of slave devices, having identical terminal arrangements, comprising:
a through-wire for interconnecting at least one terminal of the slave device and an adjacent slave device;
a command reception unit configured to receive an identification command from said master device; and an ID setting unit configured to set the ID of the slave device based on said identification command;

wherein the positions of the terminals that are interconnected with said adjacent slave device differing in each slave device, so that, in each slave device, said slave device command reception unit receive an identification command having a modified value as a result of transiting through-wires that are connected at differing positions in each slave device.

7. A slave device for a stacked device comprising a stack of a master device and a plurality of slave devices, having identical terminal arrangements, comprising:

a through-wire for interconnecting at least one terminal of the slave device and an adjacent slave device;

a command reception unit configured to receive an identification command from said master device or an adjacent slave device;

a command modification unit configured to modify the received identification command to a slave device specific identification command; and a second command transmission unit configured to input the modified identification command to an adjacent slave device via said through-wire; and an ID setting unit configured to set an ID for the slave device as a result of receiving said identification command.

* * * * *